(12) United States Patent
Brown et al.

(10) Patent No.: US 6,546,982 B1
(45) Date of Patent: Apr. 15, 2003

(54) MOUNTING TRANSPONDERS IN PNEUMATIC TIRES

(75) Inventors: Robert Walter Brown, Medina, OH (US); Richard Stephen Pollack, Boulder, CO (US)

(73) Assignee: The Goodyear Tire & Rubber Company, Akron, OH (US)

( * ) Notice: Subject to any disclaimer, the term of this patent is extended or adjusted under 35 U.S.C. 154(b) by 0 days.

(21) Appl. No.: 09/744,463

(22) PCT Filed: Jul. 29, 1999

(86) PCT No.: PCT/US99/17403

§ 371 (c)(1),
(2), (4) Date: Jan. 23, 2001

(87) PCT Pub. No.: WO00/07834

PCT Pub. Date: Feb. 17, 2000

Related U.S. Application Data

(60) Provisional application No. 60/095,176, filed on Aug. 3, 1998.

(51) Int. Cl.[7] .............................................. B60C 19/00
(52) U.S. Cl. .................... 152/152.1; 152/367; 152/524; 156/123; 156/110.1; 29/825; 29/601; 29/595
(58) Field of Search .............................. 29/601, 592.1, 29/825, 595, 593, 596; 152/152.1, 367, 523, 524; 156/123, 110.1; 73/146

(56) References Cited

U.S. PATENT DOCUMENTS

| | | |
|---|---|---|
| 3,665,387 A | 5/1972 | Enabnit |
| 3,787,806 A | 1/1974 | Church |
| 3,831,161 A | 8/1974 | Enabnit |
| 3,872,424 A | 3/1975 | Enabnit |
| 4,052,696 A | 10/1977 | Enabnit |
| 4,067,235 A | 1/1978 | Markland et al. |
| 4,099,157 A | 7/1978 | Enabnit |

(List continued on next page.)

FOREIGN PATENT DOCUMENTS

| | | |
|---|---|---|
| EP | 0687836 | 4/1994 |
| EP | 0689950 | 5/1995 |
| EP | 0906839 | 9/1998 |
| WO | WO90/12474 | 10/1990 |
| WO | WO99/53740 | 10/1999 |

*Primary Examiner*—Gregory Huson
*Assistant Examiner*—Huyen Le
(74) *Attorney, Agent, or Firm*—Howard M. Cohn

(57) ABSTRACT

Method and apparatus for mounting a transponder module (602, 602a, 702, 951, 1000, 1020, 1102, 1102', 1402) and an antenna (740, 740', 862, 940, 1140, 1140', 1200, 1300, 1320, 1360, 1360', 1440, 1460) in a pneumatic tire (312, 630, 1204, 1350, 1350'), and for coupling or connecting the antenna to the transponder module. A patch (600, 700, 700', 850, 950, 980, 1100, 1100', 1210, 1356, 1356', 1400) has an opening (620, 720, 720', 856, 956, 986, 1120, 1120', 1420) extending to a cavity (622, 722, 860, 960, 990, 1122, 1122', 1422) within the body of the patch. The transponder module is removably retained in the cavity by a resilient annular lip (624, 724, 724', 858, 958, 988, 1124, 1124', 1424) extending around the opening. End portions (742/744,742'/744', 864/868, 942/944, 972/974, 1142/1144, 1142'/1144', 1322e/1324e, 1362/1364, 1362'/1364') of the antenna extend into the patch, and may be connected to a coupling coil (750, 750', 866, 938, 968) disposed within the patch for coupling RF signals from the antenna to a corresponding coupling coil (760, 760', 953, 1004, 1024) in the transponder module. Alternatively, the patch may have contact pads or plugs (1152/1154, 1152'/1154', 1452/1454) disposed therein for making electrical connections with corresponding contact pads (1132/1134, 1132'/1134', 1432/1434) disposed on an external surface (1106, 1406) of the transponder module.

19 Claims, 14 Drawing Sheets

U.S. PATENT DOCUMENTS

| | | |
|---|---|---|
| 4,108,701 A | 8/1978 | Stanley |
| 4,168,198 A | 9/1979 | Stanley |
| 4,319,220 A | 3/1982 | Pappas et al. |
| 4,334,215 A | 6/1982 | Frazier et al. |
| 4,857,893 A | 8/1989 | Carroll |
| 4,911,217 A | 3/1990 | Dunn et al. |
| 5,181,975 A | 1/1993 | Pollack et al. |
| 5,218,861 A | 6/1993 | Brown et al. |
| 5,285,189 A | 2/1994 | Nowicki et al. |
| 5,368,082 A | 11/1994 | Oare et al. |
| 5,479,171 A | 12/1995 | Schuermann |
| 5,483,827 A * | 1/1996 | Kulka et al. ............... 73/146.5 |
| 5,500,065 A | 3/1996 | Koch et al. |
| 5,731,754 A | 3/1998 | Lee, Jr. et al. |
| 6,030,478 A * | 2/2000 | Koch et al. ............... 152/152.1 |
| 6,192,746 B1 * | 2/2001 | Wilson ..................... 152/152.1 |
| 6,388,636 B1 * | 5/2002 | Brown et al. ......... 343/700 MS |
| 6,443,198 B1 * | 9/2002 | Koch et al. ............... 152/152.1 |
| 6,444,069 B1 * | 9/2002 | Koch et al. ............... 152/152.1 |

* cited by examiner

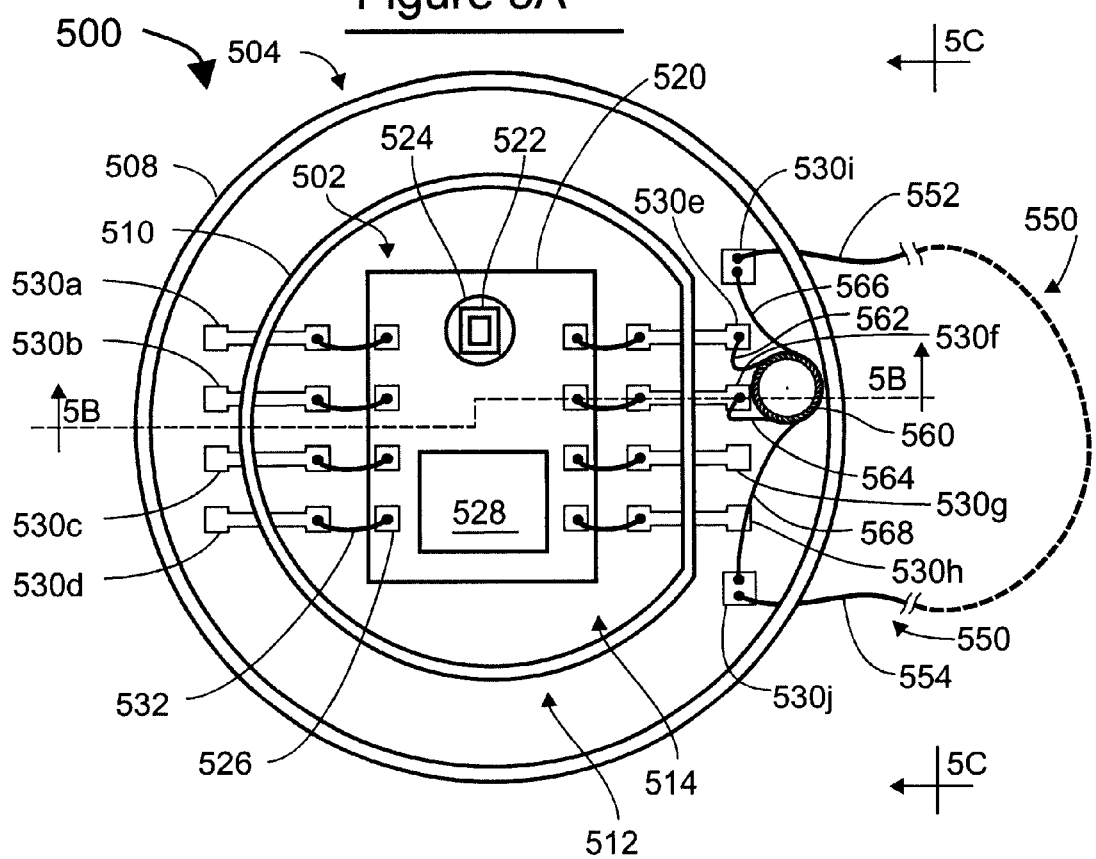
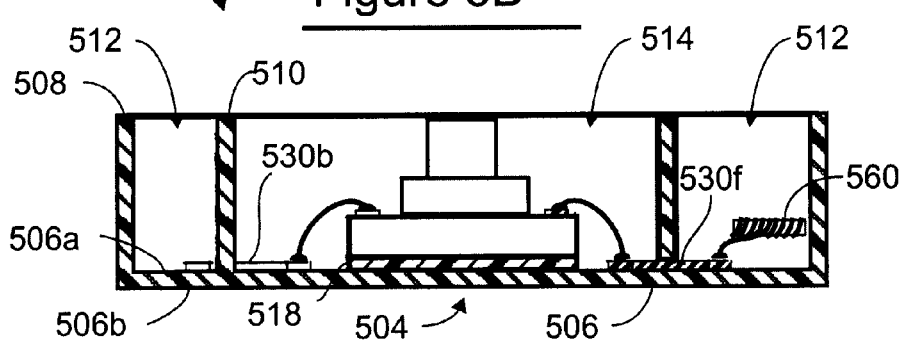
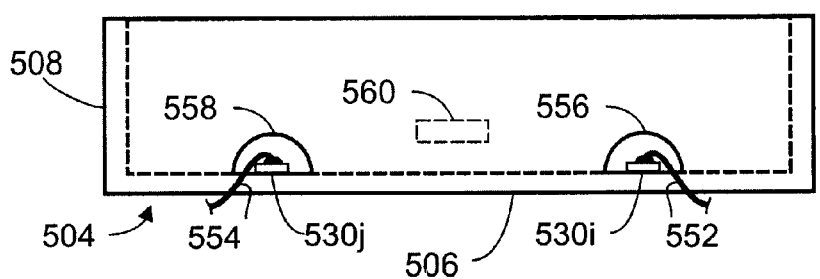

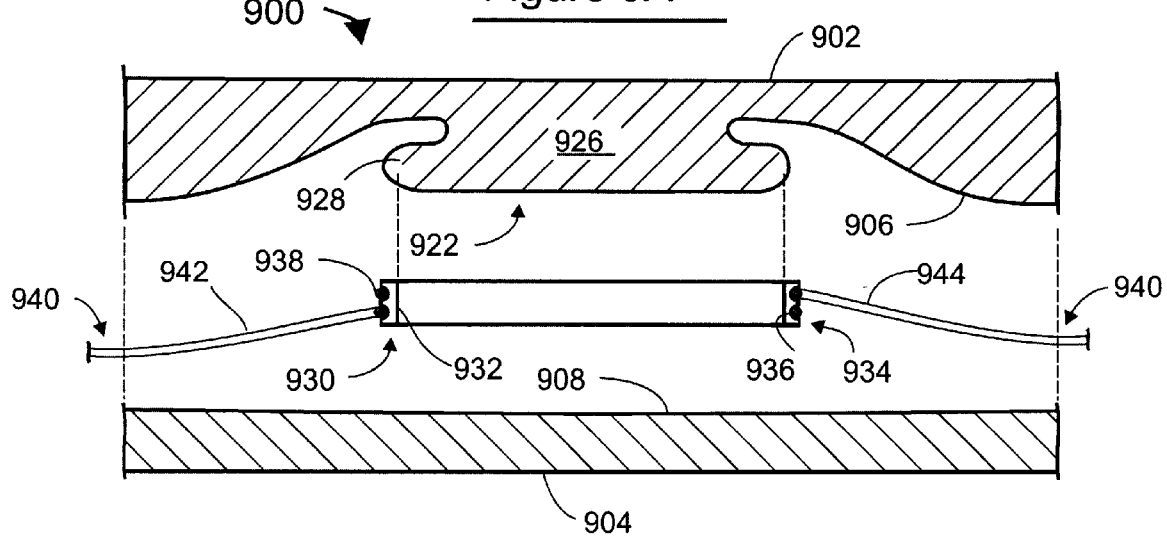
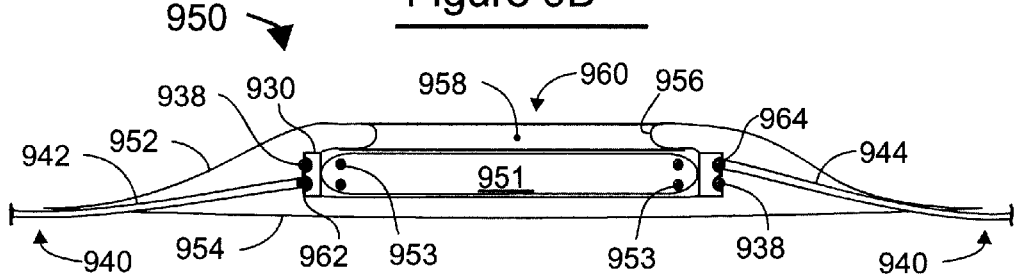
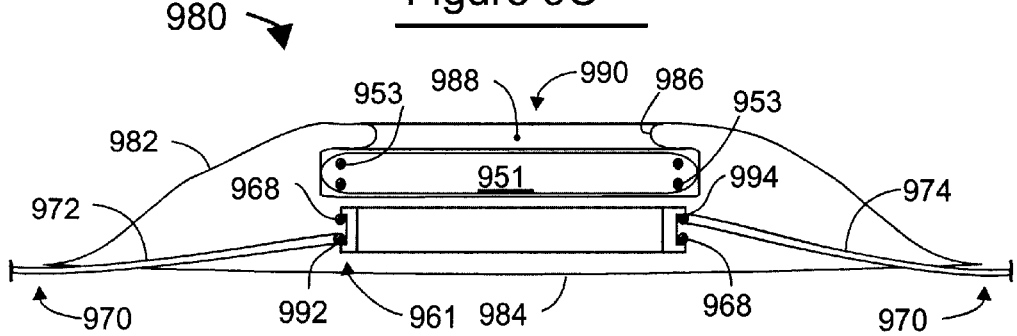

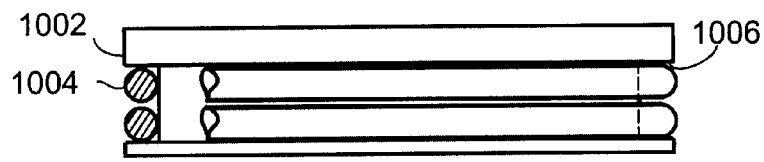
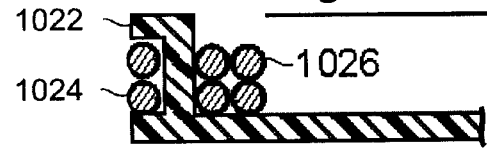
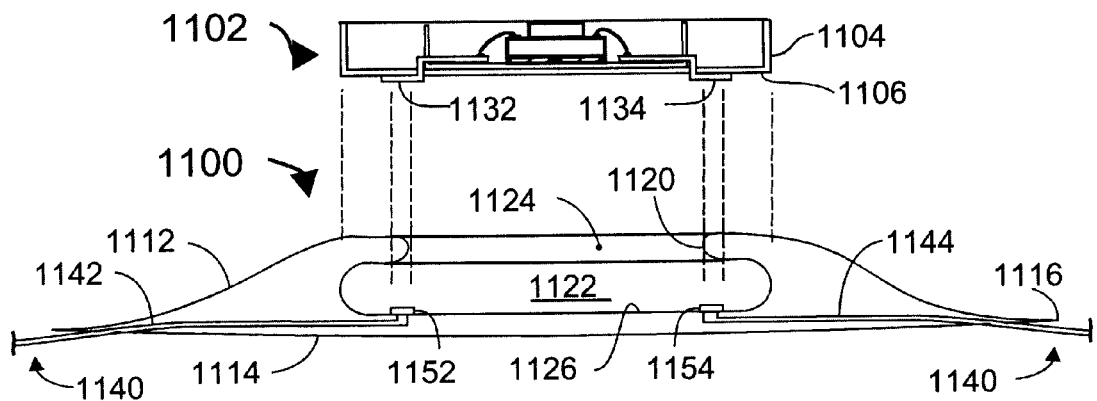
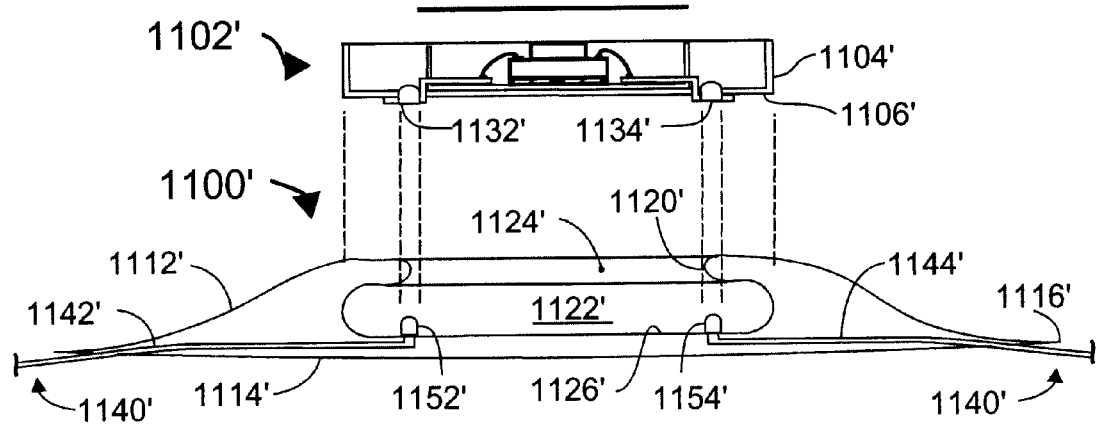

MOUNTING TRANSPONDERS IN PNEUMATIC TIRES

CROSS-REFERENCE TO RELATED APPLICATIONS

This application is a continuation-in-part of commonly-owned, copending US Provisional Patent Application No. 60/095,176, filed Aug. 3, 1998 by Brown and Pollack.

TECHNICAL FIELD OF THE INVENTION

The invention relates to the mounting of electronic devices such as transponders and antennas in pneumatic tires, and to the coupling of transponders to antennas in pneumatic tires.

BACKGROUND OF THE INVENTION

The Assignee's Ongoing Development Efforts

Examples of the strides Goodyear has taken in the advancement of tire and related technologies includes, but is not limited to, the following patented inventions:

Commonly-owned U.S. Pat. No. 3,665,387 (Enabnit; 1972), entitled SIGNALLING SYSTEM FOR LOW TIRE CONDITION ON A VEHICLE, incorporated in its entirety by reference herein, discloses a low tire pressure warning system adaptable for any number of wheels of a vehicle and providing dashboard indications of system operation and low pressure conditions while the vehicle is in motion.

Commonly-owned U.S. Pat. No. 3,831,161 (Enabnit; 1974), entitled FAIL-SAFE MONITORING APPARATUS, incorporated in its entirety by reference herein, discloses monitoring vehicle tire pressure wherein the operator is warned of an abnormal or unsafe condition of one or more of the tires.

Commonly-owned U.S. Pat. No. 3,872,424 (Enabnit; 1975), entitled APPARATUS AND METHOD FOR TRANSMITTING AUXILIARY SIGNALS ON EXISTING VEHICLE WIRING, incorporated in its entirety by reference herein, discloses communicating with low tire pressure monitoring circuits using power pulses carried on existing vehicle wiring (e.g., the turn signal circuits).

Commonly-owned U.S. Pat. No. 4,052,696 (Enabnit; 1977), entitled TIRE CONDITION MONITOR, incorporated in its entirety by reference herein, discloses a tire condition sensing circuit that includes a ferrite element that changes from a ferromagnetic to a non-ferromagnetic state in response to a temperature increase above the material Curie point.

Commonly-owned U.S. Pat. No. 4,099,157 (Enabnit; 1978), entitled SINGLE WIRE POWER/SIGNAL SYSTEM FOR VEHICLE AUXILIARY DEVICES, incorporated in its entirety by reference herein, discloses providing both power to and receiving detection signals from a remotely located condition monitoring device using a single wire with ground return through the vehicle frame.

Commonly-owned U.S. Pat. No. 4,108,701 (Stanley; 1978), entitled METHOD FOR MAKING HOSE INCORPORATING AN EMBEDDED STATIC GROUND CONDUCTOR, and related U.S. Pat. No. 4,168,198 (Stanley; 1979), entitled APPARATUS FOR MAKING HOSE INCORPORATING AN EMBEDDED STATIC GROUND CONDUCTOR, both incorporated in their entirety by reference herein.

Commonly-owned U.S. Pat. No. 4,911,217 (Dunn, et. al.; 1990), entitled INTEGRATED CIRCUIT TRANSPONDER IN A PNEUMATIC TIRE FOR TIRE IDENTIFICATION, incorporated in its entirety by reference herein, discloses an RF transponder in a pneumatic tire. FIG. 1a of this patent illustrates a prior-art identification system ("reader") that can be used to interrogate and power the transponder within the tire. The identification system includes a portable hand-held module having within it an exciter and associated circuitry for indicating to a user the numerical identification of the tire/transponder in response to an interrogation signal.

Commonly-owned U.S. Pat. No. 5,181,975 (Pollack, et. al.; 1993), entitled INTEGRATED CIRCUIT TRANSPONDER WITH COIL ANTENNA IN A PNEUMATIC TIRE FOR USE IN TIRE IDENTIFICATION, incorporated in its entirety by reference herein, discloses a pneumatic tire having an integrated circuit (IC) transponder and pressure transducer. As described in this patent, in a tire that has already been manufactured, the transponder may be attached to an inner surface of the tire by means of a tire patch or other similar material or device.

Commonly-owned U.S. Pat. No. 5,218,861 (Brown, et al.; 1993), entitled PNEUMATIC TIRE HAVING AN INTEGRATED CIRCUIT TRANSPONDER AND PRESSURE TRANSDUCER, incorporated in its entirety by reference herein, discloses a pneumatic tire having an integrated circuit (IC) transponder and pressure transducer mounted within the pneumatic tire. Upon interrogation (polling) by an external RF signal provided by a "reader", the transponder transmits tire identification and tire pressure data in digitally-coded form. The transponder is "passive" in that it is not self-powered, but rather obtains its operating power from the externally-provided RF signal.

The commonly-owned U.S. Patents referenced immediately hereinabove are indicative of the long-standing, far-reaching and ongoing efforts being made by the Goodyear Tire & Rubber Company in advancing tire product technology.

Tire Transponder Systems, Generally

As used herein, a "transponder" is an electronic apparatus (device) capable of monitoring a condition such as air pressure within a pneumatic tire, and then transmitting that information to an external device. The external device can be either an RF (radio frequency) reader/interrogator or, simply an RF receiver. A simple receiver can be used when the transponder is "active", and has its own power source. A reader/interrogator would be used when the transponder is "passive" and is powered by an RF signal from the reader/interrogator. In either case, in conjunction with the external device, the transponder forms a component of an overall tire-condition monitoring/warning system. In order to send or receive RF signals, a transponder must have an antenna. This antenna may either be incorporated into the transponder module itself, or it may be external to the transponder module and electrically connected or coupled to it in a suitable manner.

U.S. Pat. No. 5,500,065, incorporated in its entirety by reference herein, and discussed in greater detail hereinbelow illustrates (at FIG. 2 thereof) an exemplary prior art transponder within a tire, and illustrates (at FIG. 5 thereof) an exemplary prior art interrogator which can be used to communicate with and retrieve digitally coded information from the transponder. This patent discloses various methods, described in greater detail hereinbelow, for mounting, including embedding during manufacturing the tire, the transponder (monitoring device) within the tire.

Commonly-owned U.S. Pat. No. 4,911,217, incorporated in its entirety by reference herein, illustrates (at FIG. 1a thereof) another exemplary prior art interrogating tire identification system (10) in combination with a passive integrated circuit transponder (24) in a tire (22).

Safe, efficient and economical operation of a motor vehicle depends, to a significant degree, on maintaining the correct air pressure in all (each) of the tires of the motor vehicle. Failure to correct quickly for faulty/abnormal (typically low) air pressure may result in excessive tire wear, blow-outs, poor gasoline mileage and steering difficulties.

The need to monitor tire pressure when the tire is in use is highlighted in the context of "run-flat" (driven deflated) tires, tires which are capable of being used in a completely deflated condition. Such run-flat tires, as disclosed for example in commonly-owned U.S. Pat. No. 5,368,082, incorporated in its entirety by reference herein, may incorporate reinforced sidewalls and mechanisms for securing the tire bead to the rim to enable a driver to maintain control over the vehicle after a catastrophic pressure loss, and are evolving to the point where it is becoming less and less noticeable to the driver that the tire has become deflated. The broad purpose behind using run-flat tires is to enable a driver of a vehicle to continue driving on a deflated pneumatic tire for a limited distance (e.g., 50 miles, or 80 kilometers) prior to getting the tire repaired, rather than stopping on the side of the road to repair the deflated tire. Hence, it is generally desirable to provide a low-pressure warning system within the vehicle to alert (e.g., via a light on the dashboard, or a buzzer) the driver to the loss of air in a pneumatic tire. Such warning systems are known, and do not form part of the present invention, per se.

Numerous tire-pressure warning systems are known in the art. Representative examples of such may be found in the patent references described hereinbelow. The present invention is not limited to a particular type of transponder.

Although the use of pressure transducers in pneumatic tires (in association with electronic circuitry for transmitting pressure data, such as transponder) is generally well known, these pressure-data systems for tires have been plagued by difficulties inherent in the tire environment. Such difficulties include effectively and reliably coupling RF signals into and out of the tire, the rugged use the tire and electronic components are subjected to, as well as the possibility of deleterious effects on the tire from incorporation of the pressure transducer and electronics in a tire/wheel system.

Tires for motor vehicles are either tubeless, or require an inner tube to maintain pressure in the tire. In either case, the tire is typically mounted on a wheel (rim). The use of an inner tube is typical of truck tires, in contrast to tubeless tires which are typically found on cars, pickup trucks, sports/ utility vehicles, minivans and the like. The present invention is primarily directed to mounting a transponder within a tubeless tire.

For tubeless tires, various transponder mounting locations are known, and include (i) mounted to an inner surface of the tire, (ii) mounted to the wheel, and (iii) mounted to a valve stem. The present invention is primarily directed to mounting a transponder to an inner surface of the tire.

U.S. Pat. No. 3,787,806 (Church, 1974), incorporated in its entirety by reference herein, discloses a tire pressure warning apparatus for operation in a pneumatic tire in combination with an inner tube. As described in this patent, means are provided to protect the individual components while permitting the necessary flexibility to conform to the shape and motion of the inner surface of the tire. The tire pressure warning apparatus (10) is vulcanized, or otherwise adhered (hermetically sealed) to an external (FIGS. 1–3) or internal (FIGS. 4–6) surface of an inner tube (18). More particularly, the tire pressure warning apparatus (10) comprises a pressure sensor (12), a transmitter (14) and a power supply such as a battery (16). The transmitter (14) is housed in an inflexible enclosure (24) such as a hard plastic box or the like. The battery (16) is housed in a suitable inflexible enclosure (22) such as a hard plastic box or the like. Leads (32, 34) connecting the sensor (12) to the battery enclosure (22) and leads (36, 38) connecting the battery enclosure (22) with the transmitter (14) are formed using stranded wire, and are coiled to permit flexing of the apparatus (10) without incurring wire breakage. The apparatus (10) is encased in any suitable elastic material (40) such as natural rubber or the like, to permit a flexibility comparable to that of the inner tube (18). In the embodiment (FIGS. 4–6) wherein the apparatus (10) is mounted to the inside of the inner tube (18A), the elastic material (40A) is seen to have areas of reduced thickness between the sensor (12A), battery (16A) and transmitter (14A) to readily permit flexing of the warning apparatus (10A). A key feature of the apparatus (10) of this patent is that the pressure sensor (12), transmitter (14) and power supply (16) are separate units connected to one another by flexible leads (32, 34, 36, 38) and surrounded by a flexible material (40) to generate a single composite unit and to permit flexing of each of the separate units relative to one another, the flexible material being adhered to the inner tube and conforming in shape to the inner surface of the tire.

U.S. Pat. No. 5,285,189 (Nowicki, et al.; 1994), incorporated in its entirety by reference herein, discloses an abnormal tire condition warning system comprising a radio transmitting device (A) including a radio circuit (10), a tire condition sensor (20), a control circuit (11) and a battery power supply (12). The radio circuit (10), control circuit (11), sensor (20) and battery (12) are contained in a housing (16) typically of plastic or the like, including a base wall (18) which is configured for close reception against the wheel rim (22) in the tire wheel cavity. Typically, the housing (16) is attached by means of a band (24) and adjustable tightening means (26).

U.S. Pat. No. 4,067,235 (Markland, et al.; 1978), incorporated in its entirety by reference herein, discloses a tire pressure monitoring (measuring) system, and illustrates various embodiments of mounting a remote tire pressure sensor in or on a tire. As shown in FIG. 3, the remote tire pressure sensor (21) may be encapsulated by a suitable elastomeric compound and bonded to the wall of the tire (22). As shown in FIG. 9, the tire pressure sensor (21') may be formed in the shape of a sphere and introduced inside of the tire as a free-rolling element. As shown in FIG. 8, the tire pressure sensor (21") may be miniaturized and embedded within the casing of the tire (22) during manufacture. As shown in FIG. 7, the tire pressure sensor (21''') may be incorporated into a repair plug inserted into the sidewall of the tire (22). Another feature illustrated (see FIGS. 3, 7, 8, 9) in this patent is a receiving antenna 38 and a retransmitting antenna 26, both of which are discussed in greater detail hereinbelow.

U.S. Pat. No. 4,334,215 (Frazier, et al.; 1982), incorporated in its entirety by reference herein, discloses monitoring heat and pressure within a pneumatic tire using a transmitter and other circuit elements mounted to a circuit board which is secured to the inside of the tire by an overlaying elastic adhesive material.

U.S. Pat. No. 5,500,065 (Koch, et al.; 1996), hereinafter referred to as the "'065 Patent", incorporated in its entirety by reference herein, discloses a method for embedding a monitoring device ("tag") within a tire during manufacture.

The device can be used for monitoring, storing and telemetering information such as temperature, pressure, tire mileage and/or other operating conditions of a pneumatic tire, along with tire identification information. The monitoring device (10) is comprised of a microchip (20), an antenna (30), an amplifier (42), a battery (44), a pressure sensor (46), and optional temperature and mileage/distance sensors, populating a circuit board (48). The monitoring device may optionally (but desirably) be contained (encased) in a rigid or semi-rigid encasement to enhance rigidity and inhibit straining of the device. The reinforcing encasement or encapsulation is a solid material, i.e., non-foam compounds, which are compatible with the tire rubber, such as various urethanes, epoxies, unsaturated polyesterstyrene resins, and hard rubber compositions. FIG. 1 of the '065 Patent illustrates a method of securing such a monitoring device (10 or 10') to an inner wall of a pneumatic tire (5) at two preferred locations: (i) in the vicinity of the tire bead below the end of the body ply turn-up where the sidewall bending stiffness is greatest and where the rolling tire stresses are at a minimum; and (ii) on the inside of the tire at the center of the tread crown where stresses from mounting and dismounting are at a minimum. The specific attachment or adhering means can be through the use of a chemical cure adhesive including a room temperature amine curable adhesive or a heat-activatable cure adhesive. FIGS. 7, 8, 9 and 10 of the '065 Patent illustrate additional methods of mounting a monitoring device within a tire. An encased monitoring device, or monitoring device assembly (17), can be adhered with a flexible cover (80) while resting on the inner surface of the tire (FIG. 7), or while resting in a pocket formed in the inner surface of the tire (FIG. 8). Suitable housing materials which function to hold the monitoring device to the tire include generally flexible and resilient rubbers such as natural rubber or rubbers made from conjugated dienes having from 4 to 10 carbon atoms such as synthetic polyisoprene, polybutadiene, styrene-butadiene rubber, and the like, flexible polyurethanes, flexible epoxides, and the like. The cover (80) is secured to an interior wall (7) of the tire. The cover (80) has an adhering surface which secures the monitoring device assembly to a surface of the tire, preferably within the pressurizable tire cavity. As shown in FIG. 7 of the '065 Patent, the cover (80) may surround the monitoring device assembly (17), and is secured to the interior portion of the tire about the perimeter of the monitoring device assembly. As shown in FIG. 8 of the '065 Patent, the monitoring device assembly (17) may be located within a tire pocket or recess (75) which can be made by inserting a rectangular billet of appropriate dimensions onto the uncured tire innerliner at the location of the desired recess (75). During tire manufacturing, the curing pressure of the mold will press the billet into the tire inner liner and cure in the recess pocket (75). The cover (80) is then attached about the perimeter of the monitoring device assembly to the tire inner liner. The cover (80) may be co-cured with the green tire or may be attached to the tire after curing by use of various types of adhesives, including ambient temperature amine curable adhesives, heat-curable adhesives, and chemical-curable adhesives such as various self-vulcanizing cements, various chemical vulcanizing fluids, and the like. The flexible cover (80) can be attached to the tire with the monitoring device already in place or, alternatively, the monitoring device, whether or not encapsulated, can be inserted through a slot (84) in a flexible cover (80) which is already attached to the tire. FIGS. 11 and 12 of the '065 Patent illustrate another method of mounting a monitoring device within a tire. The monitoring device is contained within a housing pocket (90) which has a slot for mounting the assembly within the pocket and through which the antenna (30) of the monitoring device can project after assembly. A band (98) is included for securing and biasing the antenna (30) to a raised portion (102) of the pocket. FIGS. 13 and 14 of the '065 Patent illustrate a method of embedding the device within a tire, and includes placing the device between a tie-gum ply (199) and inner liner ply (200) of an uncured tire, at a location in the vicinity of the tire crown (202) or at a location near the tire bead (210), respectively. After curing, the device is permanently contained in the tire structure. FIG. 15 of the '065 Patent illustrates another method of embedding the monitoring device assembly within a tire. The monitoring device assembly (17) is sandwiched between the uncured tire inner liner ply (200) and an inner liner patch (222). After curing, the monitoring device assembly (17) is permanently embedded between the patch (222) and the ply (200).

U.S. Pat. No. 5,731,754 (Lee, Jr., et al.; 1998), incorporated in its entirety by reference herein, discloses a transponder and sensor apparatus (10) for sensing and transmitting vehicle tire parameter data. The apparatus (10) includes a substrate (12) which is preferably flexible. The substrate (12), various sensors, and a transponder (18) mounted on or adjacent to the substrate (12) are disposed in a housing (7) formed of an encapsulating medium. Preferably, the encapsulating medium (7) is formed of cured rubber for compatibility with a vehicle tire, and may be formed to any desired shape. As shown in FIG. 7, the apparatus (10) may be integrally mounted within the tire (60) during the manufacture of the tire (60), and a suitable mounting position is in the upper portion of the side wall (66) adjacent to the bead (64), as this location exhibits the least amount of flexure during use of the tire (60). As shown in FIG. 8, the apparatus (10) may be mounted on the inner liner of the tire (60) adjacent to the bead (64). In this case, the elastomeric patch or membrane (59) is mounted over the apparatus (10) and sealingly joined to the inner liner to fixedly mount the apparatus (10) in registry with the tire. Referring to FIG. 2, another feature illustrated in this patent is an antenna (36).

An electronics package (module) including an RF transponder component of a tire-condition monitoring system may be mounted to an inner surface of a pneumatic tire, either after the tire is manufactured or during its manufacture. This electronics package will hereinafter generally be referred to as a "transponder module", or more simply as a "transponder".

One challenge associated with mounting the transponder (module), is ensuring that the pressure sensor component of the transponder is in fluid communication with the cavity of the tire so that air pressure within the tire can be detected/measured. The aforementioned '065 Patent (U.S. Pat. No. 5,500,065) proposes various solutions to this problem. FIG. 6 of the aforementioned '065 patent illustrates, for example, providing an opening or aperture (18) in the encasement or encapsulating material (16) to allow an air path to the pressure sensor (46) so that it can measure the internal air pressure. FIGS. 7 and 8 of the aforementioned '065 patent illustrate, for example, providing a slit (84) in the cover (80) to allow for detection of air pressure. FIGS. 13 and 14 of the aforementioned '065 patent illustrate, for example, providing a small removable dowel (206) which will press through the inner liner ply portion (200) of the tire during curing to form a hole or aperture for air passage to the pressure sensor in the monitor assembly (transponder) (17). FIG. 15 of the aforementioned '065 patent illustrates, for example, inserting a dowel (220) through the inner liner patch (222) and then into the transponder (17). The dowel must be removed after building the tire to allow fluid communication through the hole or aperture to the underlying pressure sensor. This represents an additional step which, if overlooked, can render the transponder inoperative for its intended purpose. Commonly-owned PCT Patent Application No. PCT/US97/22570 discloses using a wicking means associated with the pressure sensor to provide a path for pressure equilibrium between the pressure sensor and the inflation chamber. FIG. 6 of the aforementioned U.S. Pat. No. 5,731,754 discloses a transponder covering which is a thin elastomeric or rubber membrane (59) which transfers pressure from the interior of the tire to the pressure sensor (50) by means of a pressure transfer medium (57) which is disposed in the cavity between the membrane and sensor. Typically, in the mounting techniques of the prior art, the transponder is not readily accessible for replacement or maintenance.

Another challenge when mounting a transponder or a housing (cover) for the transponder (see, e.g., FIG. 10 and the cover 80 of the aforementioned U.S. Pat. No. 5,500,065) during building the tire, is inherent in putting any "foreign object" on the tire building drum during lay-up of the green tire. Such a "lump" on an otherwise substantially cylindrical build drum can interfere with (adversely affect) the spacing and/or alignment of cords (wire filaments) laid across (typically in the axial direction) the build drum. These cords are typically on the order of approximately 0.15–0.30 mm in diameter, spaced uniformly, circumferentially about the build drum.

Another challenge when mounting a transponder in a tire during building the tire is inherent in the high levels of heat generally applied during this process. Many electronic components found in the typical transponder are sensitive to such levels of heat, and may be damaged in the process. Alternately, custom-designed and therefore more expensive electronics may need to be selected for use in transponders intended for this kind of use.

Antenna Design and Location Considerations

An antenna is evidently an important feature of an RF transponder, and specific mention of this feature has been made hereinabove. Generally speaking, there are two main configurations and locations for the antenna of a tire transponder: (i) a "coil" antenna, typically located with the transponder in a package; and (ii) a "loop" antenna extending from the transponder about the circumference of the tire.

In addition to these two main configurations and locations, U.S. Pat. No. 4,857,893 (Carroll; 1989), incorporated in its entirety by reference herein, discloses a configuration wherein all electrical circuits of a transponder device, as well as an antenna (receiving/transmitting coil), may be realized on a single monolithic semiconductor chip.

FIGS. 3, 7, 8 and 9 of the aforementioned U.S. Pat. No. 4,067,235 illustrate various configurations and locations of antennas for transponders. As illustrated in FIG. 1, the remote tire pressure sensor (transponder, 21) includes two antennas: (i) a secondary receiving antenna (38); and (ii) a secondary re-transmitting antenna (26). As mentioned above, FIG. 3 illustrates a remote tire pressure sensor (21) encapsulated by a suitable elastomeric compound and bonded to the inner wall of the tire (22). The entire electronic circuit is placed on a semiconductor body or wafer and is surrounded by the secondary receiving antenna (38). Directly below the wafer is the secondary re-transmitting antenna (26). Both antennas (38 and 26) are located within the elastomeric compound encapsulating the remote tire pressure sensor (21). FIG. 8 illustrates an arrangement wherein the secondary receiving antenna (38) is wound around the circumference of the sensor (21"), and the secondary re-transmitting antenna (26) is disposed closely adjacent the semiconductor body (128). FIG. 7 illustrates the secondary receiving antenna (38) extending around and within the periphery of the sensor (21'''), and the secondary re-transmitting antenna (26) disposed closely adjacent the semiconductor body (128). FIG. 9 illustrates a remote tire pressure sensor (21') in the shape of a sphere which can be introduced inside the tire (22) as a free-rolling element. The sensor (21') includes a secondary receiving antenna (38) that is circumferentially wound around the surface of the sphere. The secondary re-transmitting antenna (26) is located near the center of the sphere.

FIG. 2 of the aforementioned U.S. Pat. No 5,731,754 illustrates locating the antenna (36) as being a patch antenna mounted on a substrate (12) upon which are also mounted other components of the transponder, such as a battery (14), pressure sensing means (50) and other electronic components (e.g., temperature sensor (110), means (120) for detecting tire revolution, and a timer (134)).

FIG. 11 of the aforementioned U.S. Pat. No. 5,500,065 illustrates an antenna extending from a housing pocket (90) which has a cavity (94) for holding the monitoring device assembly. The pocket (90) also includes a band (98) for securing and biasing an antenna (30) of the monitoring device assembly to a raised portion (102) of the pocket.

The above-described antenna configurations and locations are all examples of small, typically coil antennas which are located with the transponder module itself. There follows a description of a loop-type antenna which extends around the circumference of the tire.

PCT Patent Application No. PCT/US90/01754 (published Oct. 18, 1990 as WO90/12474), incorporated in its entirety by reference herein, discloses a vehicle tire identification system wherein electronic transponders (20) are embedded within vehicle tires (40). The transponder includes a receiver/transmitter coil (26) of one or more loops of wire (54) strategically placed along the sidewall or in proximity to the tread face of the tire. The coil (26) functions as an antenna for the transponder (20) and is coupled to a coil (14) functioning as the antenna of an interrogator (reader/exciter) unit. A typical vehicle tire (40) is shown in FIG. 2. Its inner circumference is reinforced by a bead (41) which is a closed loop of wire. The sensitivity of the transponder antenna/coil (44) is adversely affected if it is too close to the bead (41). Conversely, the tread face (42) of the tire is subject to wear and therefore it is important to locate the coil (44) away from the wear hazard of the tread (42). FIG. 3 illustrates various possible locations for the antenna/coil (44A, 44B, 44C) which is embedded within the carcass of the tire. FIG. 4 illustrates alternative locations for the transponder wires (antenna/coil). For example, at a location (50) which is inside the steel belts but near the inner surface of the tire (45), or at a location (51) which is between layers of steel belts, or at a location (52) which is just outside of the belts and within the tread of the tire. A typical tire transponder is shown in FIG. 5, wherein it can be seen that the transponder antenna/coil (54) is formed of one or more turns of insulated wire or bare wire separated by insulating rubber in the manufacturing process. Acceptable materials for the wire include steel, aluminum, copper or other electrically conducting wire. As disclosed in this patent document, the wire diameter is not generally considered critical for operation as an antenna for a transponder. For durability, stranded steel wire consisting of multiple strands of fine wire is preferred. Other wire options available include ribbon cable, flexible circuits, conductive film, conductive rubber, etc. The type of wire and number of loops in the antenna/coil is a function of the anticipated environment of the tire use and the preferred distance of interrogator communication. It is proposed in this patent document that the greater the number of loops of the transponder coil, the greater the distance of successful interrogation of a given tire transponder.

The aforementioned, commonly-owned U.S. Pat. No. 5,181,975 discloses a pneumatic tire having an integrated circuit transponder which, upon interrogation by an external RF signal, transmits tire identification and/or other data in digitally-coded form. The transponder has a coil antenna of small enclosed area as compared to the area enclosed by an annular tensile member comprising a bead of the tire. The annular tensile member, during transponder interrogation, acts as the primary winding of a transformer. The coil antenna is loosely coupled to the primary winding and is the secondary winding of the transformer. The coil antenna is substantially planar in shape and, when positioned between the inner liner of the tire and its carcass ply, the transponder may include a pressure sensor responsive to tire inflation pressure. See also the aforementioned, commonly-owned U.S. Pat. No. 5,218,861.

U.S. Pat. No. 4,319,220 (Pappas, et al.; 1982), incorporated in its entirety by reference herein, discloses a system for monitoring tire pressure comprising wheel units in the tires and a common receiver. Each wheel unit has an antenna comprising a continuous wire loop embedded in an open annulus which is disposed against the inner periphery of the tire for transmitting signals and for receiving power. The antenna (152) is held against the inner periphery of the tire by its resilience and by centrifugal force. Further, to prevent side-to-side shifting when the vehicle stands still, two or three preferably molded side guides (153) are disposed into the tire. As illustrated in FIGS. 9, 10 and 11, the antenna (152) annulus is formed as an almost complete circle having a gap between its two ends. Wires (155) within the antenna (152) emerge as a pair of output wires (159a, 159b) at a single location from the open annulus. At symmetrical locations about the inside of the antenna, an electromagnetic power generator module, a gas-mass monitoring sensor module, and a signal transmitter are mounted, electrically interconnected, and suitably connected to the antenna wires 159a/159b. The interconnection wires (119a, 119b, 119c, 139a, 139b) are disposed on or in the inner surface of the antenna assembly.

U.S. Pat. No. 5,479,171 (Schuermann; 1995), incorporated in its entirety by reference herein, discloses a long, narrow antenna (14), as illustrated in FIGS. 3, 4a and 4b, mounted to or within the sidewall (30) of a tire. This antenna acts to extend the reading range for the interrogator to be a long range which is generally radially symmetrical about the tire. The antenna (14) comprises a wire which is folded back upon itself and has a coupling coil (16) formed at an end thereof. A transponder (12) has a coil (132) which may be formed as an annulus surrounding other components of the transponder (see FIG. 6) or which may be wound on a small ferrite core (220) (see FIG. 7). The attachment methods described are to affix the antenna (14) and the transponder (12) using an adhesive patch (32), or to use an integrated manufacturing process in which the antenna and transponder might be formed directly within the structure of the sidewall (30) of the tire (20).

It is thus evident that the selection of antenna type and location are non-trivial issues warranting careful design consideration, including issues of how best to connect a given antenna type to a given transponder.

Transponder-Mounting Locations

Other issues relevant to mounting a transponder module in a tire include replacing the entire transponder module if it requires replacement and, in the case of battery-powered ("active") transponders, replacing the battery if required. Preferably, the transponder, whether "active" or "passive" should represent only a fractional cost of the overall tire. Hence, replacing an entire tire because of an inoperative transponder would be highly undesirable.

In the case, for example, of a transponder unit mounted to the rim, rather than to the tire, such as is shown in the aforementioned U.S. Pat. No. 5,285,189, replacement of the transponder unit would be a relatively straightforward matter of removing the tire from the rim, replacing the transponder unit, and re-installing the tire on the rim.

In contrast thereto, consider the case, for example, of the aforementioned U.S. Pat. No. 4,067,235 wherein (see, e.g., FIG. 3 thereof) the remote tire pressure sensor (21) is encapsulated by a suitable elastomeric compound and is bonded to the wall of the tire (22), replacing the transponder would require de-bonding the elastomeric compound encasing the tire pressure sensor and re-bonding another unit to the wall of the tire. Such procedures require special care and consideration and may, in certain instances, not be feasible without causing damage (however slight) to the tire.

If, as in the aforementioned PCT Patent Application No. PCT/US90/01754 the antenna is an integral element of the tire, embedded in the carcass of the tire, problems would evidently accrue to detaching the transponder from the antenna, and re-connecting a replacement transponder to the embedded antenna -assuming, arguendo, that the transponder itself is not embedded in the carcass of the tire. The patent document describes, for example, how an integrated circuit of an electronic module (55) of a transponder may be mounted on a circuit board or substrate providing for attachment of the transponder antenna/coil wires (54) by any suitable means including welding, soldering, bonding or suitable cement.

In the case of permanently embedding the transponder within the tire, such as is shown at FIG. 13 of the aforementioned U.S. Pat. No. 5,500,065, replacing the transponder unit or any component thereof is a virtual impossibility.

The aforementioned, commonly-owned U.S. Pat. No. 5,181,975 discloses a number of locations and techniques for mounting a transponder (24) within a tire. In a tire that has already been manufactured, the transponder (24) may be attached to the axially inner side of the inner liner (30) or to the axially outer side of the tire sidewall (44) by means of a tire patch or similar material or device. (see, e.g., column 11, lines 61–65). Commonly-owned U.S. Pat. No. 5,218,861 also discloses locations and techniques for mounting an integrated circuit transponder and pressure transducer within a pneumatic tire.

A final design challenge, whether or not recognized as such by the prior art, is to provide a single, or readily modified method and apparatus for mounting a variety of transponders within a variety of pneumatic tires, with as much commonality between the variations as is possible.

OBJECTS AND SUMMARY OF THE INVENTION

It is an object of the present invention to provide method and apparatus for mounting an electronic device such as a transponder module and an antenna in a pneumatic tire, as defined in one or more of the appended claims and, as such, having the capability of being implemented in a manner to accomplish one or more of the subsidiary objects.

It is another object to provide method and apparatus for mounting a transponder module in a pneumatic tire in a manner such that the transponder may conveniently be inserted, removed, replaced and/or maintained, either during tire manufacture or after, and such that a sensor associated with the transponder is exposed to conditions within the tire.

It is another object of the present invention to provide method and apparatus for mounting a transponder and an antenna for the transponder within a pneumatic tire, and to provide for effective transformer-type coupling between the transponder and the antenna.

It is another object of the invention to provide a method for mounting a transponder module in a pneumatic tire at any point in the tire manufacturing process, with minimal impact on tire performance.

According to the invention, a patch for mounting a transponder module to an inner surface of a pneumatic tire has a body formed of a resilient material. An opening extends an external surface of the patch to a cavity. The cavity is sized and shaped to be approximately the same size and shape as the transponder module. The patch is preferably formed of a resilient material, such as halobutyl rubber. The opening preferably has a smaller dimension than the cavity, thereby forming a resilient lip about the opening, the lip being sized somewhat smaller in a corresponding dimension than the transponder module so that the transponder module may be inserted through the opening into the cavity by deflecting the lip and thereafter retained within the cavity by the annular lip. In an embodiment of the invention, the opening is circular and the lip is annular. At least one slot may be provided on the lip to facilitate deflecting the lip for inserting the transponder module past the lip into the cavity.

According to a feature of the invention, a coupling coil comprising at least a few turns of wire is disposed within the body of the patch, closely adjacent the cavity. The coupling coil is preferably concentric with the circumference of the cavity, and may either surround that circumference or be positioned close below it (on the side of the cavity opposite its opening). The coupling coil may be formed integrally with the patch, during a molding process, or may be disposed around or within a bobbin which is molded into the body of the patch.

According to a feature of the invention, an antenna is provided, having two end portions, each of which are electrically connected to a respective end of the coupling coil. The antenna extends circumferentially about an inner surface of the tire.

In an alternate embodiment of the invention, contact pads or plugs are provided in the patch, and the antenna is electrically connected to these pads/plugs. In this manner, a transponder module having contact pads on an external surface thereof may be electrically connected to the antenna when the transponder module is disposed within the cavity.

According to an aspect of the invention, the antenna may be a wire which is embedded in one or more elongate rubber strips which are disposed circumferentially about an inner surface of the tire. The wire may be an elongate helix, or a single elongate strand of wire, or multiple strands of wire, or braided wire. Alternatively, the wire may, in essence, be a conductive pathway formed of a material selected from the group consisting of carbon containing material, carbon fiber, carbon black and particulate graphite. These rubber antenna strips may be integrally molded with the patch.

According to a feature of the invention, end portions of the strips of rubber within which the antenna wires are embedded are of a conductive rubber composition. In this manner, when these end portions are overlapped, a complete 360 degree loop antenna may be formed on an inside circumferential surface of the tire.

According to alternate embodiments, antenna wires emanating from the patch as described hereinabove may be disposed circumferentially about the inner surface of the tire without electrically connecting the outer ends, thus forming a dipole antenna, instead of a loop antenna.

Other objects, features and advantages of the invention will become apparent from the description that follows.

BRIEF DESCRIPTION OF THE DRAWINGS

Reference will be made in detail to preferred embodiments of the invention, examples of which are illustrated in the accompanying drawings (Figures). The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings may be illustrated not-to-scale, for illustrative clarity.

Figure 1A:
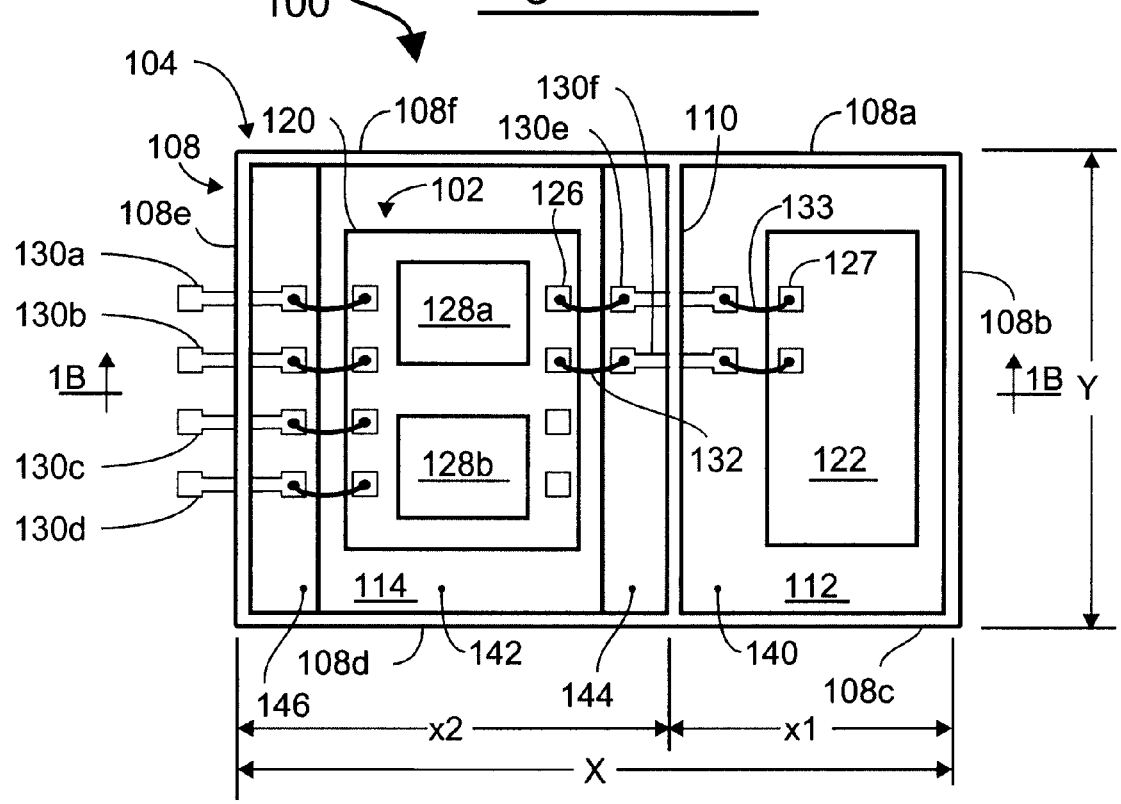

Often, similar elements throughout the drawings may be referred to by similar reference numerals. For example, the element 199 in a figure (or embodiment) may be similar in many respects to the element 299 in another figure (or embodiment).Such a relationship, if any, between similar elements in different figures or embodiments will become apparent throughout the specification, including, if applicable, in the claims and abstract.

In some cases, similar elements may be referred to with similar numbers in a single figure. For example, a plurality of elements 199 may be referred to as 199a, 199b, 199c, etc.

The cross-sectional views, if any, presented herein may be in the form of "slices", or "near-sighted" cross-sectional views, omitting certain background lines which would otherwise be visible in a true cross-sectional view, for illustrative clarity.

Figure 1B:
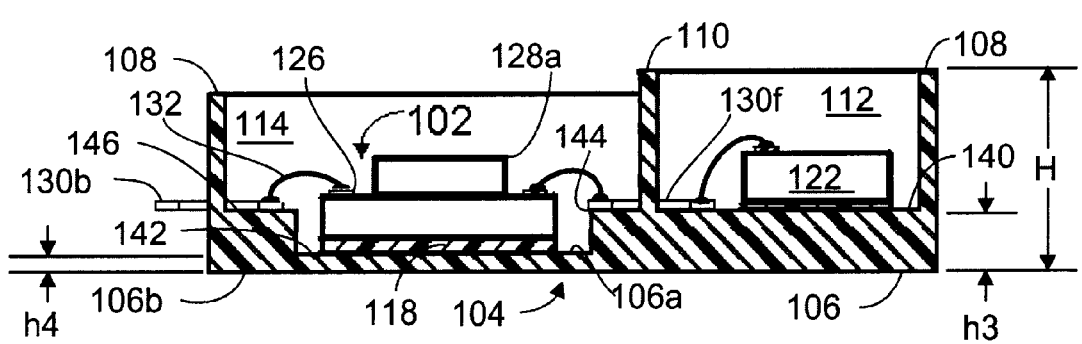
Figure 2A:
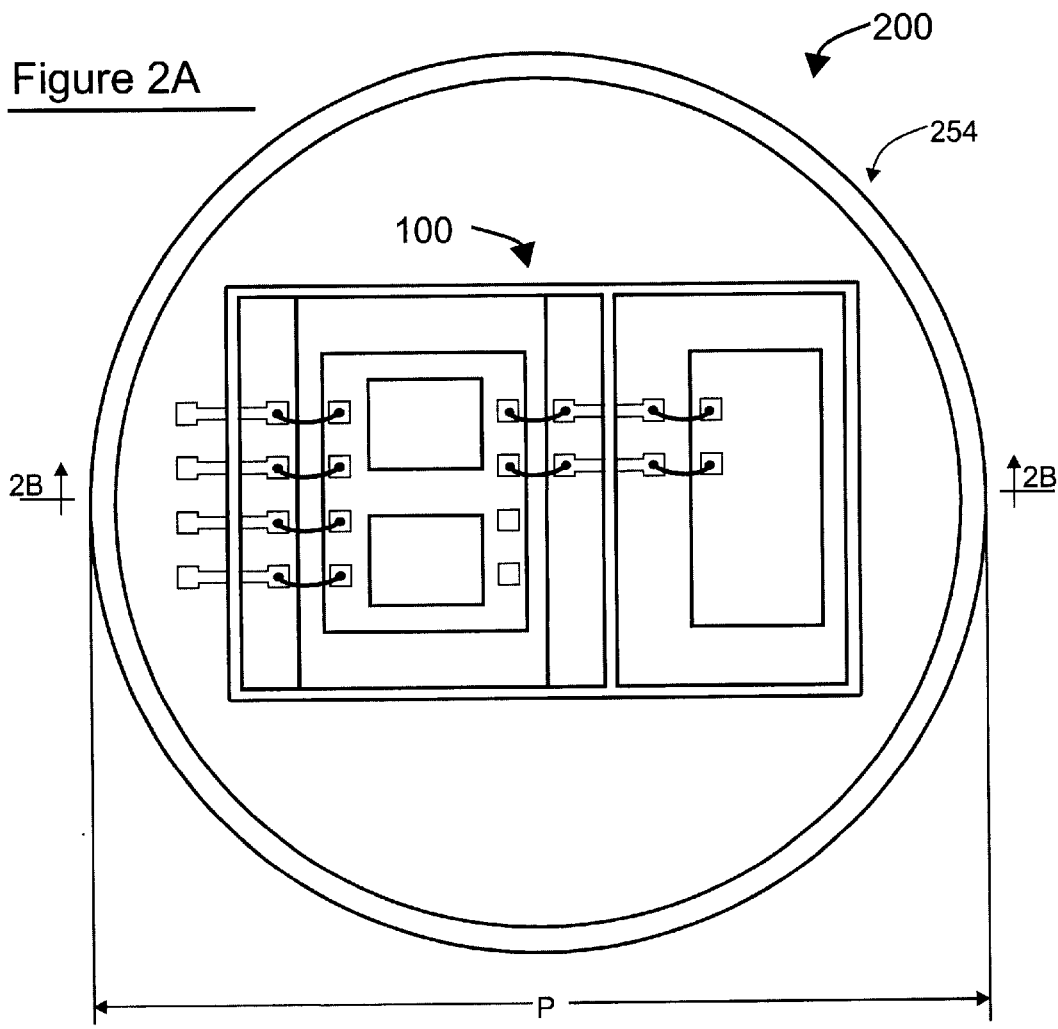
Figure 2B:
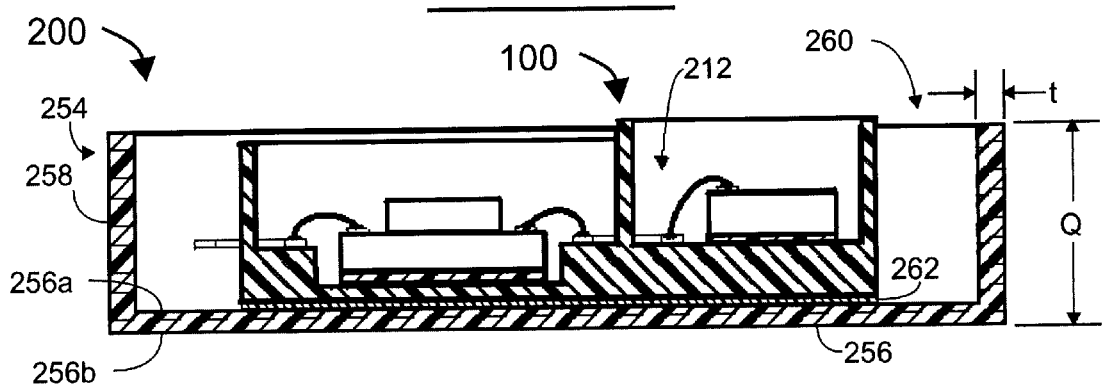
Figure 3A:
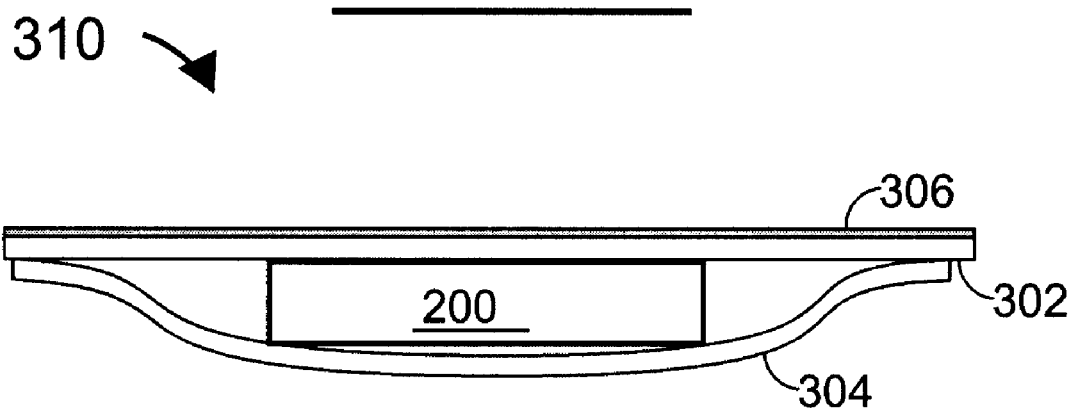
Figure 3B:
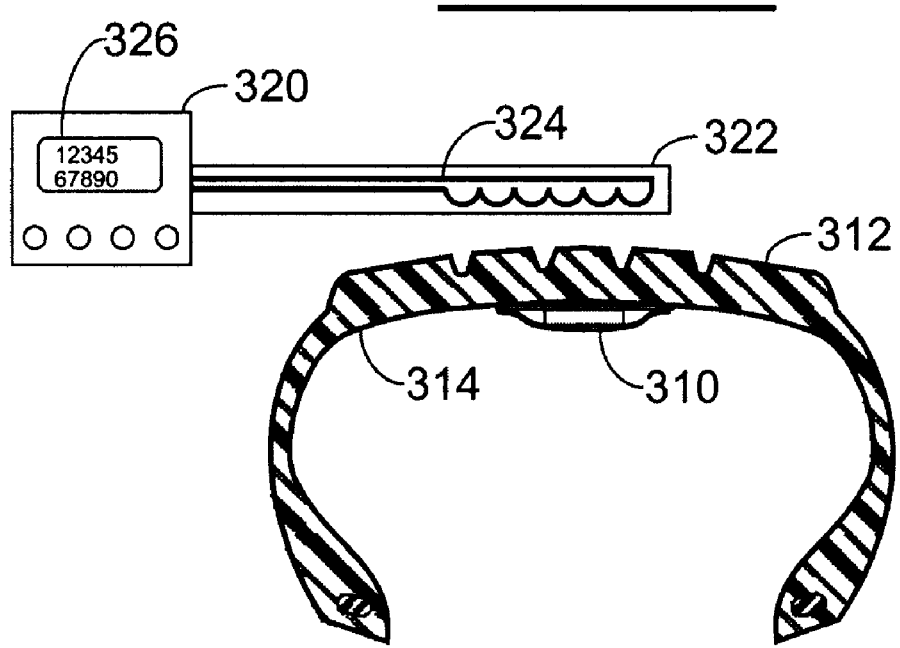
Figure 4A:
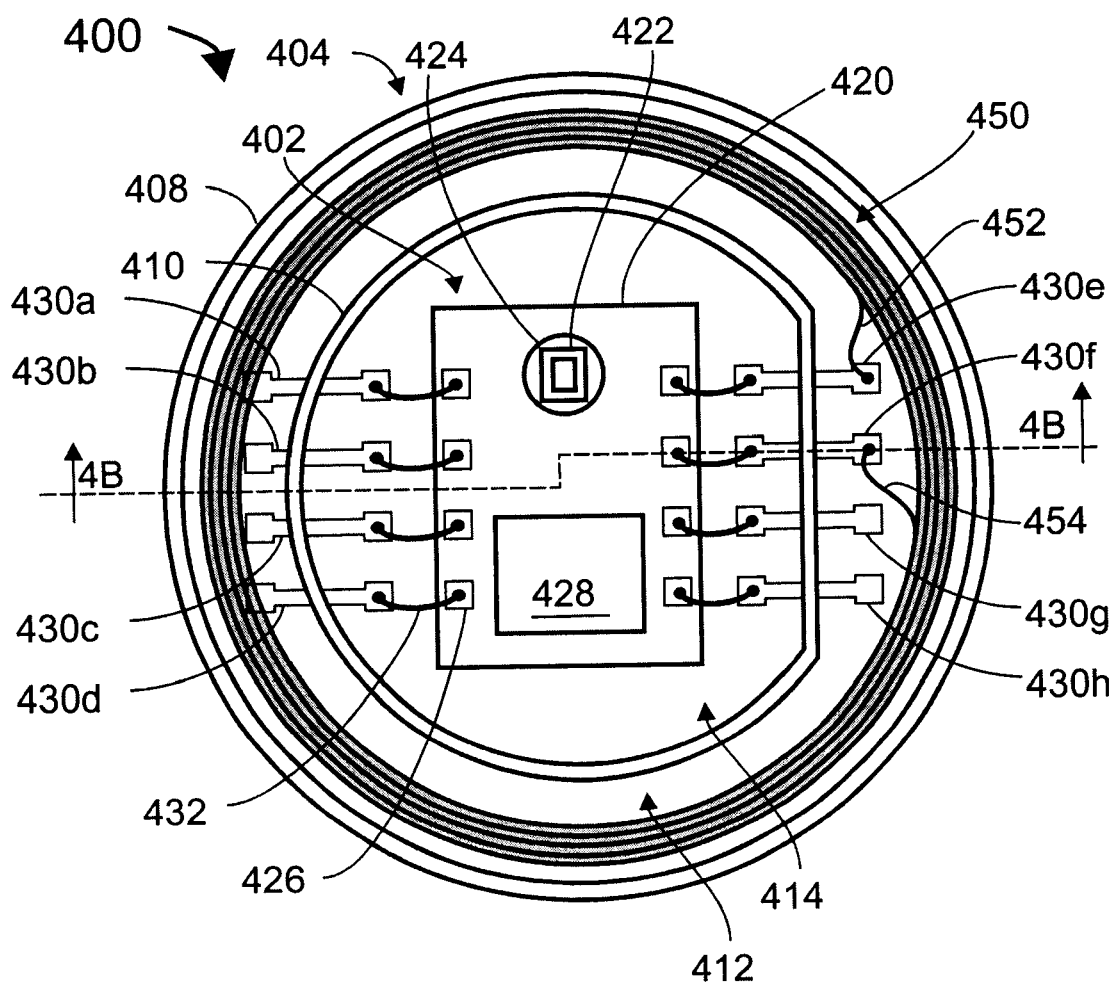
Figure 4B:
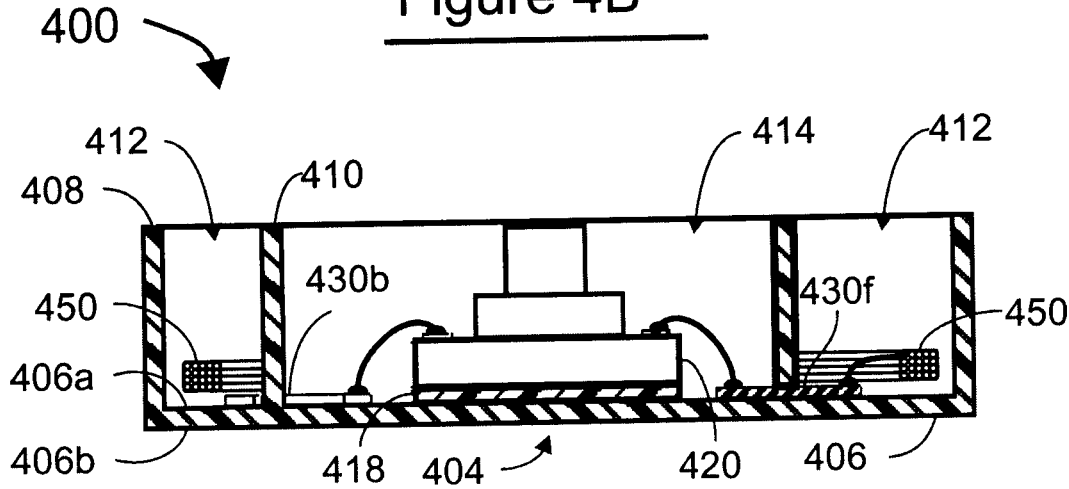
Figure 6A:
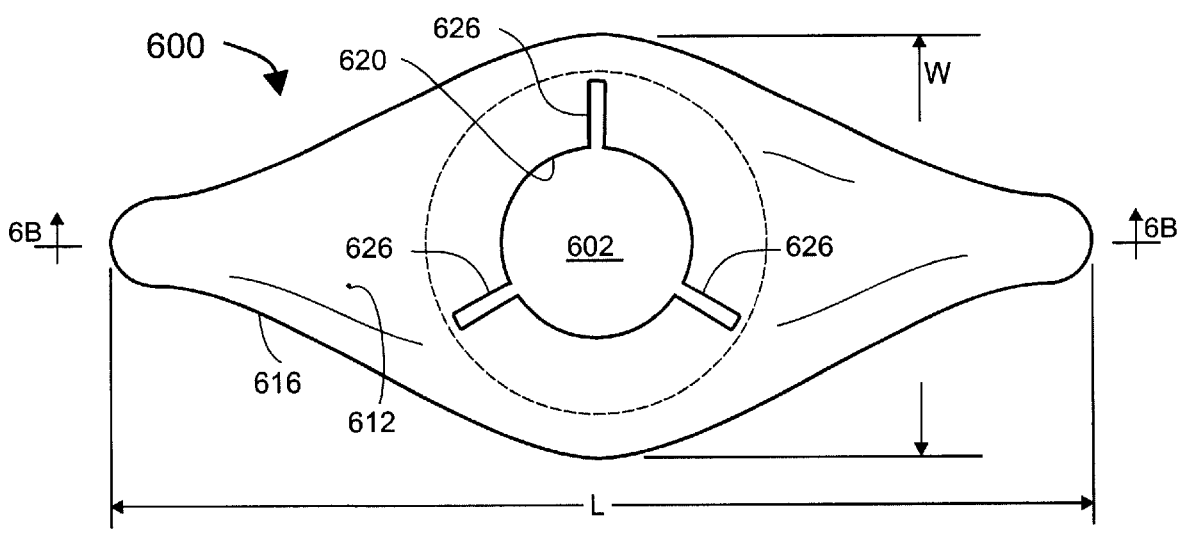
Figure 6B:
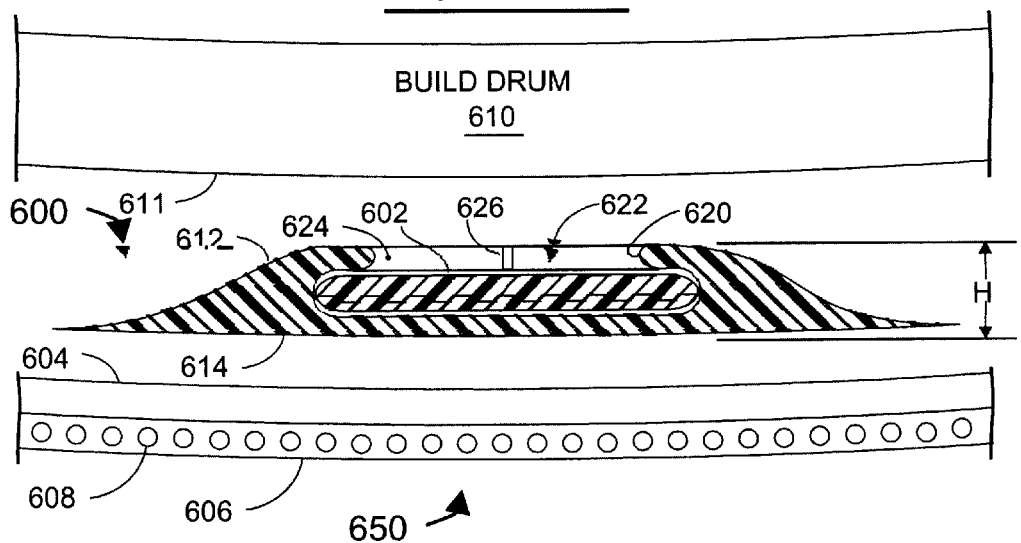
Figure 6C:
Figure 7A:
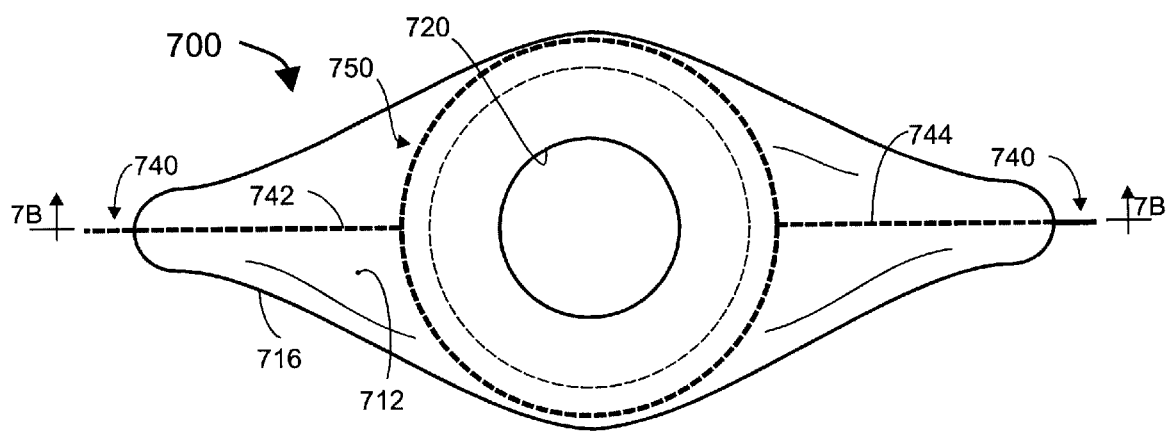
Figure 7B:
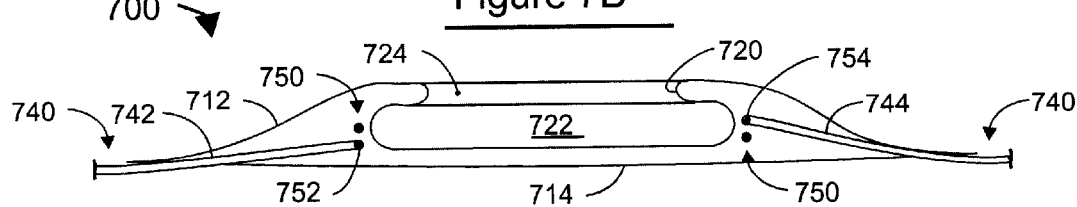
Figure 7C:
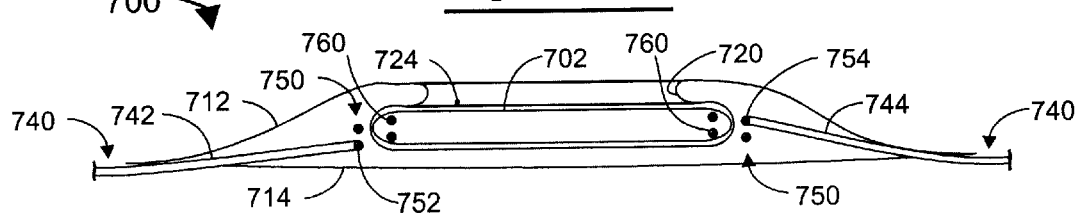
Figure 7D:
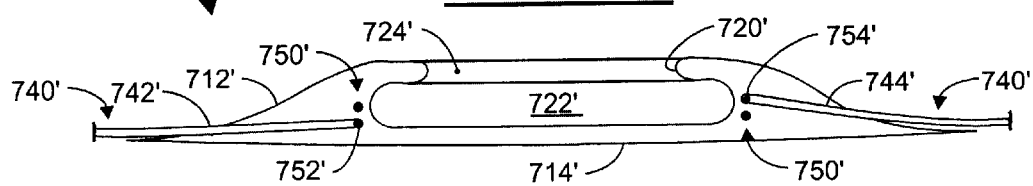
Figure 8:
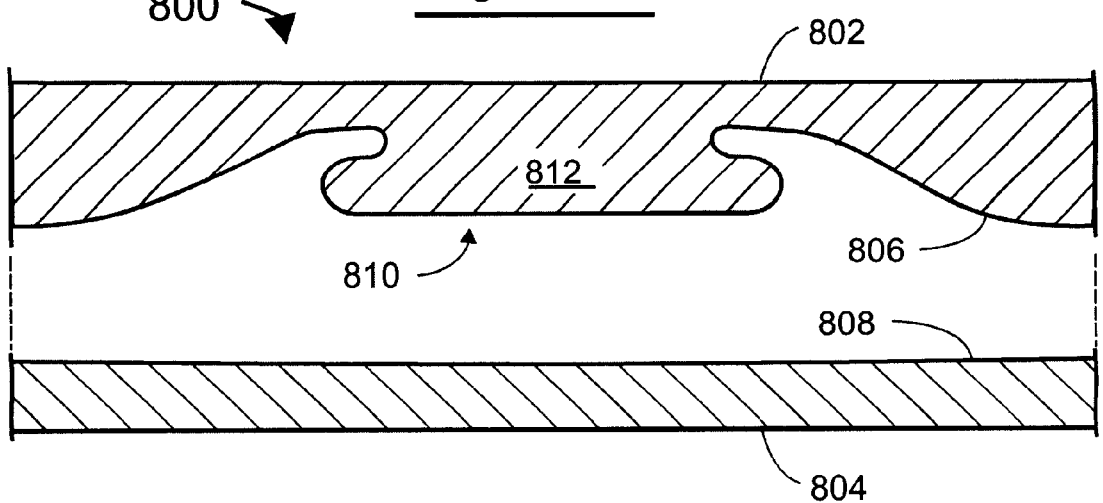
Figure 8A:
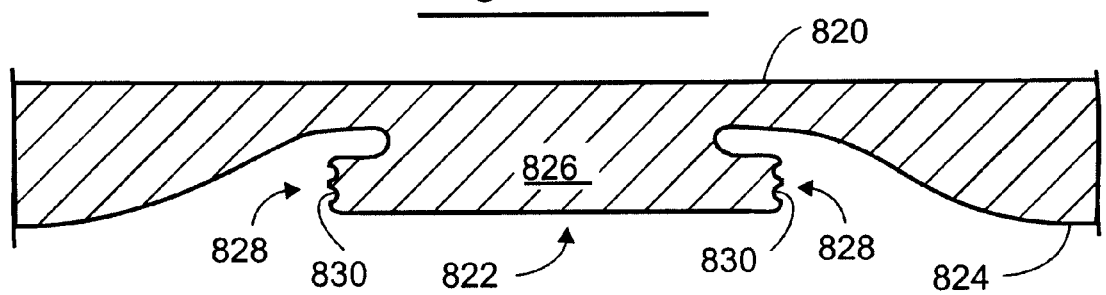
Figure 8B:
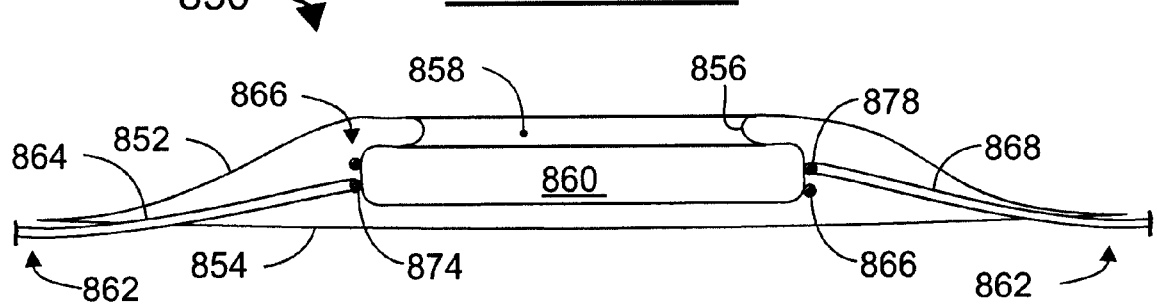
Figure 12A:
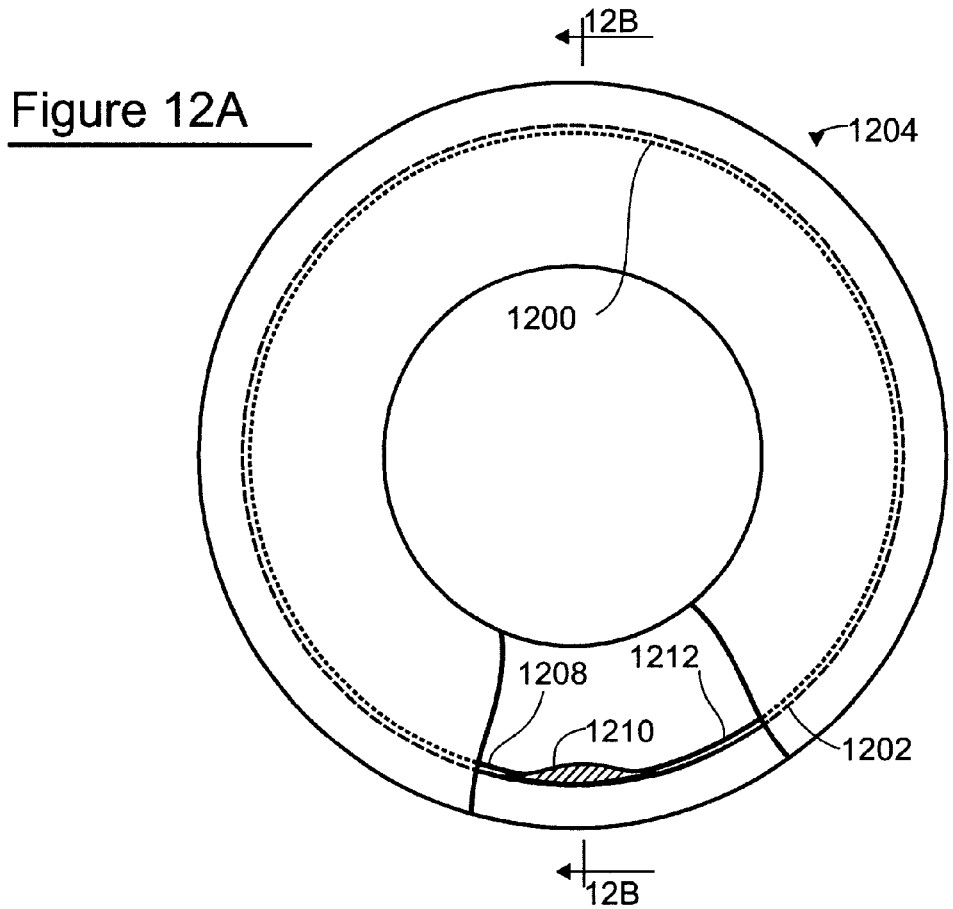
Figure 12B:
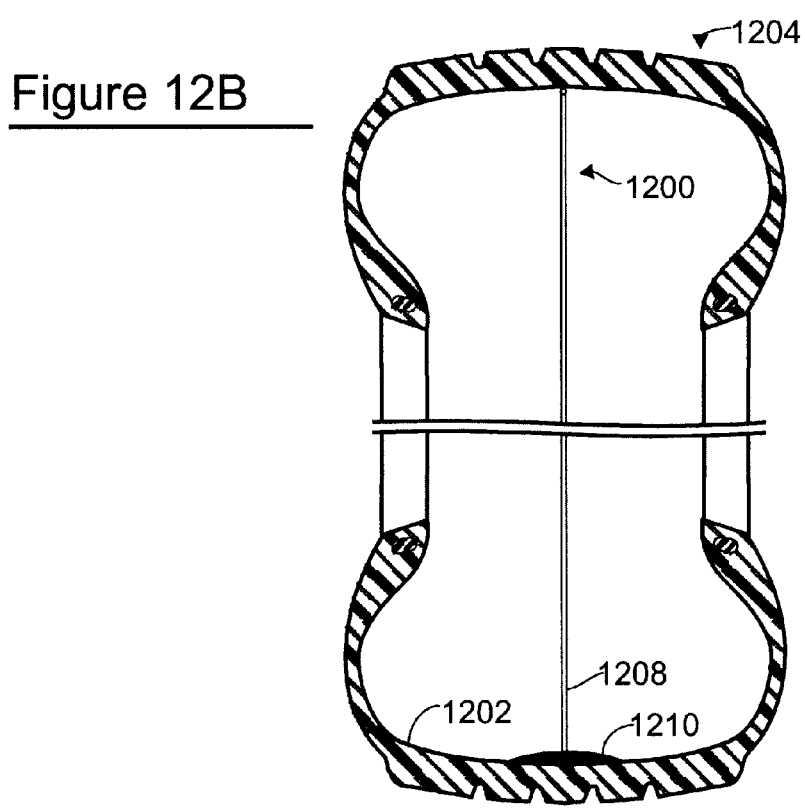
Figure 12C:
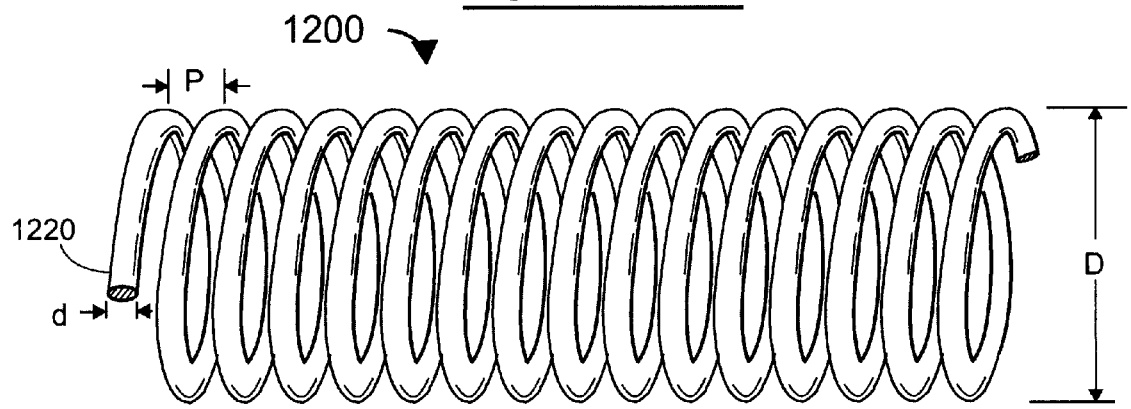
Figure 13A:
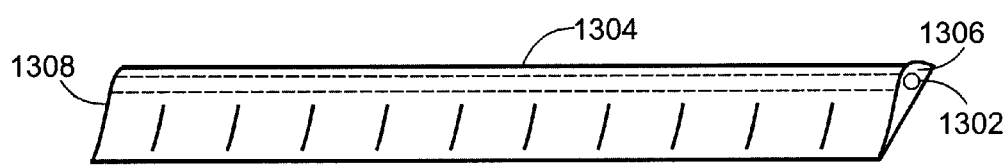
Figure 13B:
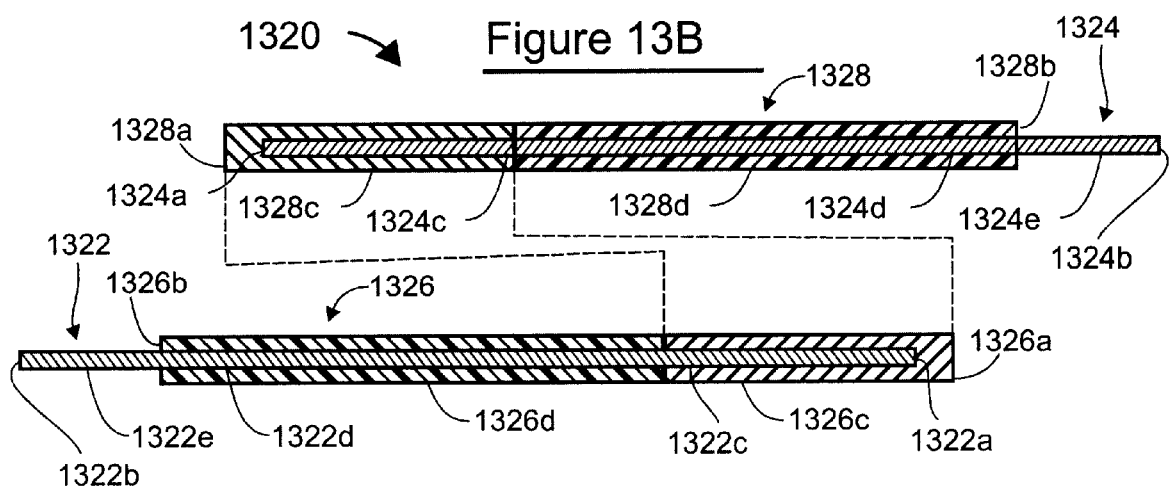
Figure 13C:
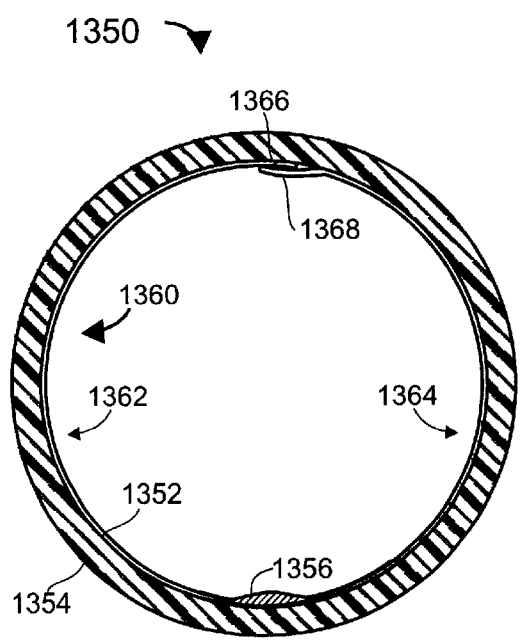
Figure 13D:
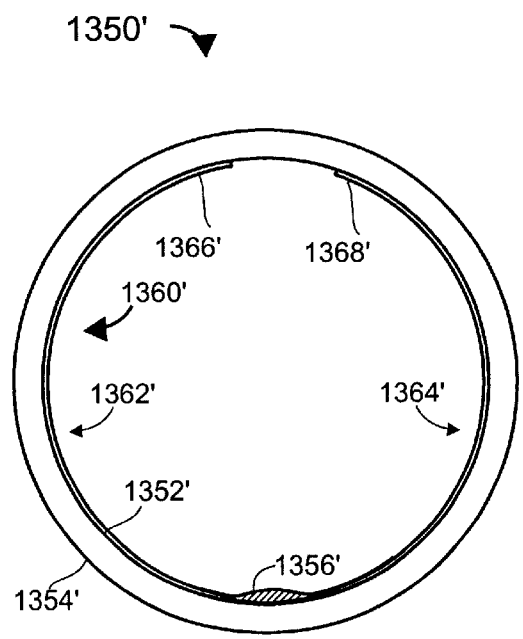
Figure 14A:
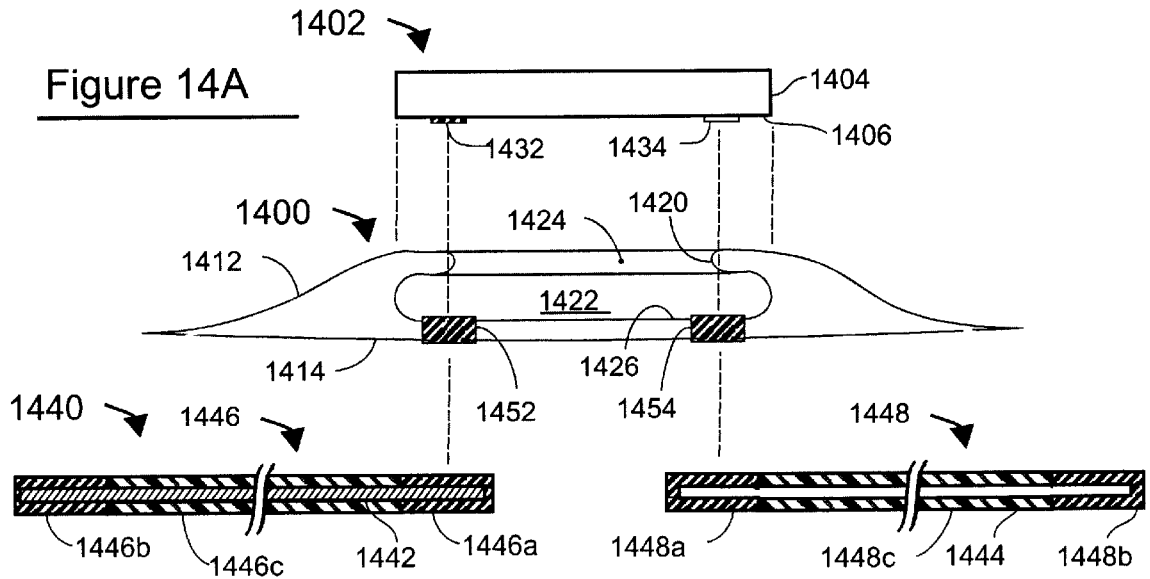
Figure 14B:
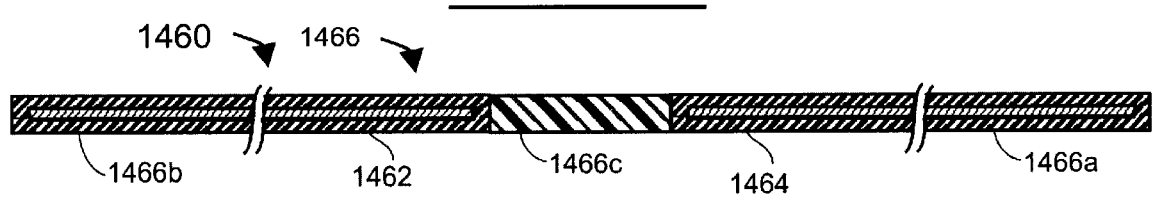
Figure 14C:
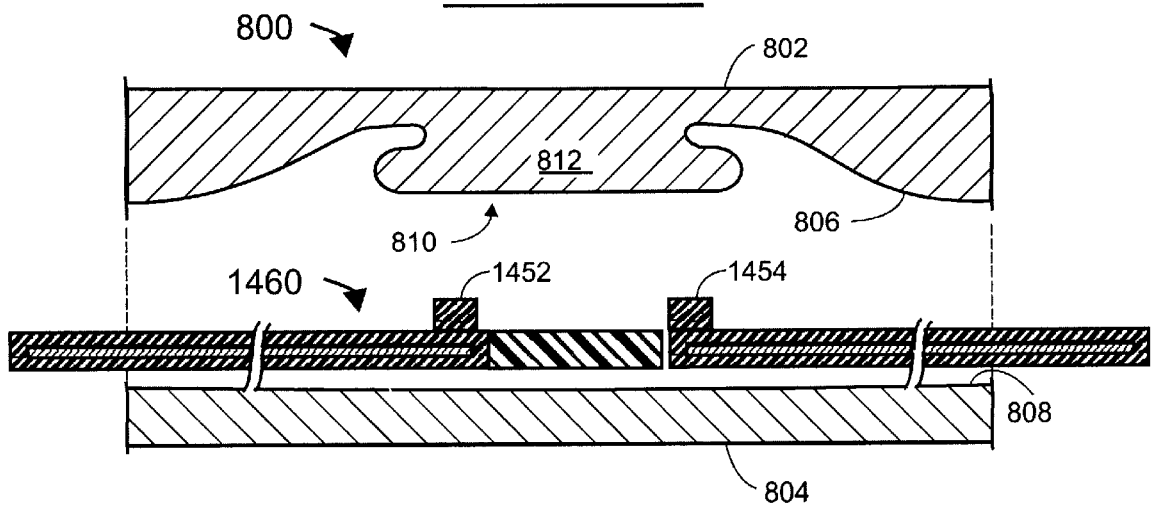

The structure, operation, and advantages of the present preferred embodiment of the invention will become further apparent upon consideration of the following description taken in conjunction with the accompanying drawings, wherein:

FIG. 1A is a top plan view of a transponder module, according to a background for the invention;

FIG. 1B is a side cross-sectional view of the transponder module of FIG. 1A, taken on a line 1B—1B through FIG. 1A, according to a background for the invention;

FIG. 2A is a top plan view of another transponder module 200, according to a background for the invention;

FIG. 2B is a side cross-sectional view of the transponder module 200 of FIG. 2A, taken on a line 2B—2B through FIG. 2A, according to a background for the invention;

FIG. 3A is a side cross-sectional view of a technique or preparing a transponder module for mounting to an inner surface of a pneumatic tire, according to a background for the invention;

FIG. 3B is a schematic illustration of a transponder module mounted in the manner described in FIG. 3A to an inner surface of a pneumatic tire, shown in cross-section, according to a background for the invention;

FIG. 4A is a top plan view of an embodiment of a transponder module which is similar to the transponder module shown in FIG. 1A with an additional electronic component disposed in an outer chamber of the package, according to a background for the invention;

FIG. 4B is a side cross-sectional view of the transponder module of FIG. 4A, taken on a line 4B—4B through FIG. 4A, according to a background for the invention;

FIG. 5A is a top plan view of an embodiment of a transponder module, similar to the embodiment shown in FIG. 4A with an additional electronic component disposed outside of the module and connected to a circuit module which is within the module, according to a background for the invention;

FIG. 5B is a side cross-sectional view of the transponder module of FIG. 5A, taken on a line 5B—5B through FIG. 5A, according to a background for the invention;

FIG. 5C is a side view of the transponder module 500 of FIG. 5A, taken on a line 5C—5C, according to a background for the invention;

FIG. 6A is a top plan view of a patch for retaining a transponder module for mounting to an inner surface of a pneumatic tire, according to the invention;

FIG. 6B is a cross-sectional view of a transponder module disposed within the patch of FIG. 6A for mounting to an inner surface of a pneumatic tire which is shown in conjunction with a build drum, according to the invention;

FIG. 6C is a cross-sectional view of another embodiment of a transponder module disposed within the patch FIG. 6A for mounting to an inner surface of a pneumatic tire, according to the invention;

FIG. 7A is a top plan view of another embodiment of a patch for retaining a transponder module for mounting to an inner surface of a pneumatic tire, and having a coupling coil incorporated therein, according to the invention;

FIG. 7B is a side cross-sectional view (cross-hatching omitted, for illustrative clarity) of the patch of FIG. 7A, taken on a line 7B—7B through the patch of FIG. 7A, according to the invention;

FIG. 7C is a side cross-sectional view (cross-hatching omitted, for illustrative clarity) of the patch of FIG. 7B with a transponder module retained in a cavity in the patch, according to the invention;

FIG. 7D is a side cross-sectional view (cross-hatching omitted, for illustrative clarity) of the patch of FIG. 7B, with an alternate configuration for antenna wires emerging from the patch, according to the invention;

FIG. 8 is a side cross-sectional view of a mold for molding a patch, according to the invention;

FIG. 8A is a side cross-sectional view of an alternate embodiment of a mold half for molding a patch, according to the invention;

FIG. 8B is a side cross-sectional view (cross-hatching omitted, for illustrative clarity) of a patch made by the technique described with respect to FIG. 8A, according to the invention;

FIG. 9A is a side cross-sectional view of an alternate embodiment of a mold for molding a patch, according to the invention;

FIG. 9B is a side cross-sectional view (cross-hatching omitted, for illustrative clarity) of a patch made by the technique described with respect to FIG. 9A, according to the invention;

FIG. 9C is a side cross-sectional view (cross-hatching omitted, for illustrative clarity) of an alternate embodiment of a patch, according to the invention;

FIG. 10A is a side plan view, partially sectioned, of a transponder module suitable for being retained by one or more of the aforementioned patches, according to the invention;

FIG. 10B is a side cross-sectional view of an alternate embodiment of a transponder module suitable for being retained by one or more of the aforementioned patches, according to the invention;

FIG. 11 is an exploded, side cross-sectional view (cross-hatching omitted, for illustrative clarity) of an alternate embodiment of a patch and an alternate embodiment of a corresponding transponder module, according to the invention;

FIG. 11A is an exploded, side cross-sectional view (cross-hatching omitted, for illustrative clarity) of an alternate embodiment of the patch and corresponding module illustrated in FIG. 11, according to the invention;

FIG. 12A is a side plan view, partially sectioned, of a tire with a patch and an antenna mounted therein, according to the invention;

FIG. 12B is a cross-sectional view of the tire of FIG. 12A, taken on a line 12B—12B through FIG. 12A, according to the invention;

FIG. 12C is a perspective view of an embodiment of an antenna for a transponder mounted within a tire, according to the invention;

FIG. 13A is a perspective view of an alternate embodiment of an antenna for a transponder mounted within a tire, according to the invention;

FIG. 13B is a cross-sectional view of an alternate embodiment of an antenna for a transponder mounted within a tire, according to the invention;

FIG. 13C is a cross-sectional view of an antenna, such as the type shown in FIG. 13B, mounted with a transponder in a patch within a tire, according to the invention;

FIG. 13D is a cross-sectional view of an alternate embodiment of an antenna, mounted with a transponder in a patch within a tire, according to the invention;

FIG. 14A is an exploded, side cross-sectional view (cross-hatching omitted from certain elements, for illustrative clarity) of a technique for mounting a transponder module within a patch and making connections to an antenna such as the type shown in FIG. 13B, according to the invention;

FIG. 14B is a side cross-sectional view of an alternate embodiment of an antenna, suitable for use in the technique described with respect to FIG. 14A, according to the invention; and FIG. 14C is an exploded, side cross-sectional view of a technique for molding a patch with an integral antenna, and contact plugs for connecting to a transponder module disposed in a cavity of the patch, according to the invention.

DETAILED DESCRIPTION OF THE INVENTION AN EXEMPLARY TRANSPONDER MODULE

FIGS. 1A and 1B, comparable to FIGS. 9A and 9B of the commonly-owned, copending PCT Patent Application No. PCT/US98/07578, illustrate an exemplary transponder module 100 for monitoring tire pressure. The present invention is not limited to this particular exemplary transponder module.

In this exemplary transponder module 100, circuitry is encapsulated in an encapsulation package (housing) 104 that has two side-by-side chambers 112 and 114 which can be filled with potting compound. In this and subsequent examples of transponder modules (e.g., 200), the potting compound is omitted from the illustrations for illustrative clarity, it being understood that the present invention is suitable for retaining a variety of transponder modules, whether potted or not, on an inside surface of a tire, as described in greater detail hereinbelow.

The encapsulation package 104 has a generally planar base portion 106. The base portion 106 has an inner surface 106a and an outer surface 106b. As best viewed in FIG. 1B, the base portion 106 is thicker in the chamber 112 than it is in the chamber 114.

An outer sidewall 108 extends upwardly from the periphery of the base portion 106. An inner sidewall 110 extends upwardly from the base portion 106, and defines and separates the two chambers 112 and 114 from one another. The first chamber 112 has a width dimension "x1" and a length dimension "y". The second chamber 114 has a width dimension x2"and a length dimension "Y".

A circuit module 102 is disposed in the second chamber 114 and is shown as having two electronic components 128a and 128b mounted to a printed circuit board (PCB) 120.

A first portion 130a . . . 130d of the leadframe fingers extend from within the second chamber 114, through the outer sidewall 108 to the exterior of the encapsulation package 104, and a second portion 130e . . . 130f of the leadframe fingers extend from within the second chamber 114, through the inner sidewall 110 to within the first chamber 112.

The PCB interconnection substrate 120 may have electronic components 128a and 128b mounted on its front surface. Conductive pads 126 on the PCB 120 are connected with bond wires 132 to inner ends of a plurality of elongate leadframe "fingers" 130a . . . 930f.

An electronic component 122 is disposed (mounted) in the first chamber 112. Conductive pads 127 on the electronic component 122 are connected with bond wires 133 to inner ends of a plurality of elongate leadframe "fingers" 130e . . . 130f.

The circuit module 102 is an RF-transponder; the electronic component 122 is a pressure sensor; the electronic components 128a and 128b are integrated circuit devices; and the encapsulation package 104 may be mounted within a pneumatic tire.

The encapsulation package 104 is suitably formed from a thermoplastic material by a molding process, and the encapsulation package 104 may have dimensions comparable to (approximately equal to) those of the encapsulation packages described in the aforementioned commonly-owned, copending PCT Patent Application No. PCT/US98/07578.

For example, the height "H" of the outer and inner sidewalls 108 and 110 is suitably in the range of from approximately 3.0 mm to approximately 6.0 mm, such as 5.0 mm. Preferably, the inner sidewall 110 and those portions 108a, 108b and 108c of the outer sidewall 108 which, together with the inner sidewall 110 bound the chamber 112, are higher than the remaining portions 108d, 108e and 108f of the outer sidewall 108.

The dimension "x2" of the second chamber 114 may be in the range of from approximately 10.0 mm to approximately 40.0 mm, such as 20.0 mm.

The dimension "x1" of the first chamber 112 may be approximately one-half the dimension "x2", such as approximately 10 mm. The dimension "X" (X=x1+x2) is suitably approximately 30 mm.

It should be clearly understood that the encapsulation package 104 is not limited to the dimensions set forth immediately hereinabove. The encapsulation package 104, and portions thereof, can be larger or smaller than described.

As mentioned hereinabove, the base portion 106 is thicker in the chamber 112 than it is in the chamber 114. However, as best viewed in FIG. 1B, the outer surface 106b of the base portion 106 is generally planar.

In this embodiment, the inner surface 140 of the base portion within the chamber 112, whereupon the electronic component 122 is mounted, is at a distance "h3" above the outer surface 106b of the base portion 106. The inner surface of the base portion within the chamber 114 has a central area 142, whereupon the electronic module 102 is mounted, which is at a distance "h4" above the outer surface 106b of the base portion 106. The distance "h3" is greater than the distance "h4" (h3>h4).

The inner surface of the base portion within the chamber 114 is stepped, so that an area 144 outside of the central area 142 is at a distance "h3" above the outer surface 106b of the base portion 106. In this manner, leadframe fingers (e.g., 130f) extending through the inner sidewall 110 lie in a plane on the inner surface portion 144 of the chamber 114 and the inner surface 140 of the chamber 112. In a similar manner, other portions of the inner surface of the base portion within the chamber, outside of the central area 142, can be stepped, so as to be at a distance "h3" above the outer surface 106b of the base portion 106. In this example, a portion 146 of the inner surface of the base portion within the chamber 114 is stepped, so as to be at a distance "h3" above the outer surface 106b of the base portion 106. In this manner, all of the leadframe fingers can be coplanar with one another.

As best viewed in FIG. 1B, this results in the electronic component 122 being disposed at a higher level than the electronic module 102. Importantly, the increased thickness of the base portion in the chamber 112 provides a generally more rigid base for the electronic component 122 to be mounted upon. In the context of the electronic component 122 being a pressure sensor, such as has been described hereinabove, the benefits of the pressure sensor being mounted to a relatively rigid base are evident.

FIGS. 1A and 1B also illustrate the concept that portions of the leadframe, in this case the leadframe fingers 130a . . . 130d may extend to the exterior of the package so that the leadframe can be supported within a mold. In this example, the other leadframe fingers 130e and 130f which do not extend to the exterior of the package can be supported along with the leadframe fingers 130a . . . 130d by an underlying insulating film (not shown), or by metallic webs or bridges (also not shown) which form part of the leadframe itself and which may later be excised from the leadframe. One of ordinary skill in the art to which the present invention most nearly pertains will readily understand the need to, and numerous ways available for, supporting the leadframe within a mold. Inasmuch as the techniques for doing so may vary from application-to-application, there is no need to further elaborate upon them in the description of the present invention.

The transponder module 100 illustrated and described with respect to FIGS. 1A and 1B is, for the purposes of the present invention, simply an example of a transponder module desired to be mounted within a pneumatic tire.

Another Transponder Module

FIGS. 2A and 2B, comparable to FIGS. 9C and 9D of the aforementioned commonly-owned, copending PCT Patent Application No. PCT/US98/07578, illustrate another exemplary transponder module 200 which is essentially a further packaging of the previously-described exemplary transponder module 100. The transponder module 100 shown without encapsulant, for illustrative clarity, it being understood that its two chambers (112 and 114) would be filled with potting compound(s).

An additional outer encapsulation package (housing) 254 is in the form of a simple cup-like structure, having a generally planar base portion 256. The base portion 256 is suitably circular, having a diameter "P", and has an inner surface 256a and an outer surface 256b. An annular sidewall 258 having a height "Q" extends upwardly from the periphery of the base portion 256. In this manner, a cylindrical chamber 260 is formed. The height "Q" of the sidewall may be equal to, greater than, or (preferably) no greater than the height of the sidewalls of the transponder module 100.

The transponder module 100 is within the additional encapsulation package 254 with the outer surface (106b) of its base portion (106) being disposed against the inner surface 256a of the base portion 256 of the additional encapsulation package 254. Any suitable adhesive 262, such as a drop of cyanoacrylate ("super glue"), may be used to join the transponder module 100 to the additional encapsulation package 254.

Suitable dimensions for the additional encapsulation package 254 are:

The diameter "P" of the base portion 256 is in the range of from approximately 25.0 mm to approximately 60.0 mm, such as approximately 32.0 mm;

The height "Q" of sidewall 258 is in the range of from approximately 3.0 mm to approximately 8.0 mm, such as approximately 4.0 mm; and The thickness "t" of the sidewall 258 is in the range of from approximately 0.3 mm to approximately 2.0 mm, such as approximately 1.0 mm.

It should be clearly understood that the additional encapsulation package 254 is not limited to the dimensions set forth immediately hereinabove. The additional encapsulation package 254, and portions thereof, can be larger or smaller than described, so long as the transponder module 100 fits within the circumference of the additional encapsulation package 254. The additional encapsulation package 254 is suitably molded from the same materials as the transponder encapsulation package (e.g., 104) described hereinabove.

The transponder module 200 illustrated and described with respect to FIGS. 2A and 2B is, for the purposes of the present invention, simply an example of a transponder module desired to be mounted within a pneumatic tire.

An Exemplary Method of Mounting A Transponder Module in a Pneumatic Tire

FIGS. 3A and 3B, comparable to FIGS. 10A and 10B of the aforementioned commonly-owned, copending PCT Patent Application No. PCT/US98/07578, illustrate an exemplary method of mounting the encapsulation package assembly within a pneumatic tire to provide tire pressure information to an external reader/interrogator or to a driver of a vehicle riding on the tire.

FIG. 3A shows the transponder module 200 being "sandwiched" between two thin sheets 302 and 304, such as rubber sheets, which are pressed to remove air bubbles from between the sheets and sealed around their edges. An adhesive 306 is disposed on the top (as viewed) surface of the sheet 302. In this manner, an exemplary transponder module within a "sandwich" patch 310 is ready to be mounted to an inside surface of a pneumatic tire.

FIG. 3B shows the sandwich patch 310 of FIG. 3A mounted within a pneumatic tire 312, on an inner surface thereof. An external reader/interrogator 320 having a wand 322 comprising an antenna 324 is suitably employed to poll (interrogate) the transponder circuit disposed within the pneumatic tire 312, and display data retrieved therefrom on a suitable readout 326 such as a liquid crystal display (LCD) panel. Using an external device to interact with a transponder device is well known and does not form a part of the present invention per se.

An Exemplary Transponder Module with an Internal Antenna

FIGS. 4A and 4B, corresponding to FIGS. 5A and 5B of the aforementioned commonly-owned U.S. Patent Application No. PCT/US98/07578, illustrate another embodiment of a transponder module 400 comprising an encapsulation package containing components of a transponder, including an antenna coil. The encapsulation package 404 suitably has a generally planar base portion 406 having an inner surface 406a and an outer surface 406b. An outer sidewall 408 extends upwardly (as best viewed in FIG. 4B) from the periphery of the inner surface 406a of the base portion 406. An inner sidewall 410 (compare 110) extends upwardly (as best viewed in FIG. 4B) from the inner surface 406a of the base portion 406 from a position which is within the periphery of the base portion 406. In this manner, two chambers are formed: an outer chamber 412 (compare 112) and an inner chamber 414 (compare 114) which can separately be filled with potting compound, or with two different potting compounds.

A circuit module 402 (compare 102) is disposed within the inner chamber 414 of the encapsulation package 404, and is mounted (as best viewed in FIG. 4B) to the inner surface 406a of the base portion 406 with a suitable adhesive 418 (compare 118). The circuit module 402 may comprise a PCB interconnection substrate 420 (compare 120) with an electronic component 422 (compare 122) and another electronic component 428 (compare 128) disposed on its front surface, and the electronic component 422 may be a pressure sensor surrounded by a dam 424 to prevent the sensor from being covered when the inner chamber 414 is filled with potting compound.

Pads 426 (compare 126) of the PCB 420 are connected with bond wires 432 (compare 132) to inner ends of a plurality of elongate leadframe "fingers" 430a . . . 430h (compare 130a . . . 130f) which extend from within the inner chamber 414, through the inner sidewall 410 to within the outer chamber 412.

The circuit module 402 may be an RF-transponder, the electronic component 422 may be a pressure sensor component, the electronic component 428 may be an integrated circuit, and the encapsulation package 404 may be mounted within a pneumatic tire.

In this example, an antenna 450 is disposed within the outer chamber 412. The antenna 450 is formed by a length of insulated (e.g., enamel-coated) wire having two free ends 452 and 454 and wound into a coil having several turns and, optionally several layers. As best viewed in FIG. 4A, the two free ends 452 and 454 of the antenna wire 450 are shown as being connected to portions of the two leadframe fingers 430e and 430f, respectively, which are exposed within the outer chamber 412. These may be simple solder connections. Alternatively (not shown), the exposed portions of the leadframe fingers 430e and 430f can be formed with notches or the like to mechanically "capture" the free ends 452 and 454, respectively, of the antenna wire.

The transponder module 400 illustrated and described with respect to FIGS. 4A and 4B is, for the purposes of the present invention, simply an example of a transponder module desired to be mounted within a pneumatic tire.

An Exemplary Transponder Module with an External Antenna

FIGS. 5A, 5B and 5C, corresponding to FIGS. 6A, 6B and 6C of the aforementioned commonly-owned U.S. Patent Application No. PCT/US98/07578, illustrate an application wherein an electronic device which is an RF transponder 500 (compare 400) which has an antenna component 550 which is external, rather than internal (compare 450) to the encapsulation package.

As in the previously-described embodiment (400), in this embodiment 500 the encapsulation package 504 suitably has a generally planar base portion 506 (compare 406) having an inner surface 506a (compare 406a) and an outer surface 506b (compare 406b). An outer sidewall 508 (compare 408) extends upwardly (as best viewed in FIG. 5B) from the periphery of the inner surface 506a of the base portion 506. An inner sidewall 510 (compare 410) extends upwardly (as best viewed in FIG. 5B) from the inner surface 506a of the base portion 506 from a position which is within the periphery of the base portion 506. In this manner, two chambers are formed: an outer chamber 512 (compare 412) and an inner chamber 514 (compare 414) which can separately be filled with potting compound, or with two different potting compounds.

As in the previously-described embodiment, a circuit module 502 (compare 402) is disposed within the inner chamber 514 of the encapsulation package 504, and is mounted (as best viewed in FIG. 5B) to the inner surface 506a of the base portion 506 with a suitable adhesive 518 (compare 418).

As in the previously-described embodiment, the circuit module 502 may comprise a PCB interconnection substrate 520 (compare 420) with an electronic component 522 (compare 422) and another electronic component 528 (compare 428) disposed on its front surface, and the electronic component 522 may be a pressure sensor surrounded by a dam 524 (compare 424) to prevent the sensor from being covered when the inner chamber 514 is filled with potting compound.

As in the previously-described embodiment, pads 526 (compare 426) of the PCB 520 are connected with bond wires 532 (compare 432) to inner ends of a plurality of elongate leadframe "fingers" 530a . . . 530h (compare 430a . . . 430h) which extend from within the inner chamber 514, through the inner sidewall 510 to within the outer chamber 512.

Additionally, as best viewed in FIG. 5A, two separate pads (terminals) 530i and 530j are illustrated. These pads 530i and 530j are suitably formed as part of the overall leadframe, the function of which is simply to provide terminals for connecting wires to one another.

As in the previously-described embodiment, the circuit module 502 may be an RF-transponder, the electronic component 522 may be a pressure sensor component, the electronic component 528 may be an integrated circuit, and the encapsulation package 504 may be mounted within a pneumatic tire.

In this embodiment of a transponder module 500, the antenna component 550 (shown principally as a dashed line) is external to the package 504, and is suitably formed as a length of wire having two free ends 552 and 554. Alternatively, the antenna component 550 may be a dipole-type antenna, having two separate lengths of wire (552 and 554).

As best viewed in FIG. 5C, the free ends 552 and 554 of the external antenna component 550 pass through openings 556 and 558, respectively, in the outer sidewall 508 of the package 504 so that they can be attached to the terminals 530i and 530j, respectively, within the outer chamber 512 of the package 504.

An additional component 560 is optionally disposed within the outer chamber 512 and is suitably an impedance matching transformer having two primary leads 562 and 564 attached (e.g., soldered) to two of the leadframe fingers 530e and 530f, respectively, and having two secondary leads 566 and 568 attached (e.g., soldered) to the two additional terminals 530i and 530j, respectively.

As in the previously-described embodiment, certain ones of the leadframe fingers (e.g., 530e and 530f) and additional terminals (530i and 530j) can be formed with notches or the like to mechanically "capture" the various wires which are attached thereto.

The encapsulation package assembly 500 illustrated and described with respect to FIGS. 5A, 5B and 5C is, for the purposes of the present invention, simply an example of a transponder module desired to be mounted within a pneumatic tire, in conjunction with an external antenna.

An Embodiment of a Patch for Mounting a Transponder Module

FIGS. 6A and 6B illustrate, in top plan and exploded cross-sectional views, respectively, a patch 600 for mounting a transponder module 602 on an inner surface of a pneumatic tire. As best viewed in FIG. 6B, a typical pneumatic tire 630 includes an inner liner 604 and a ply 606 having a plurality of typically metal filaments (cords) 608 disposed therein. The inner liner 604 is representative of the inside surface of the overall tire, and the patch of the present invention, in its various embodiments disclosed herein, is not limited or restricted to any particular tire construction.

As illustrated in FIG. 6B, the patch 600 of the present invention is suitably incorporated into a pneumatic tire in the course of the various tire plies being "laid up" on an outer surface 611 of a tire build drum 610. However, it should be understood that the patch of the present invention, in its various embodiments described herein, can also be mounted to an inner surface of a tire which has already been fabricated.

The transponder module 602, shown "generically" in the views of FIGS. 6A and 6B, is suitably any of the transponder modules described herein, for example the transponder module 400 shown and described with respect to FIG. 4A, which has an internal antenna 450. However, it should be understood that the patch of the present invention, in its various embodiments described herein, is not limited to any particular transponder module, but rather is readily adapted to receive and mount a wide variety of transponder modules to an inside surface of a tire.

The patch 600 has two major external surfaces, a first external surface 612 and a second external surface 614 opposite the first external surface 612, and has a periphery 616. The patch 600 has a length dimension "L", a width dimension "W", and a height dimension "H". It should be understood that the patch of the present invention, in its various embodiments described herein, is not limited to any particular dimensions other than being suitably sized and shaped to retain a transponder module for mounting to an inner surface of a pneumatic tire.

Preferably, the patch 600 tapers gradually from a maximum thickness (height) at its center to a minimum thickness at its periphery 616. The thickness of the patch 600 is the height dimension between the first external surface 612 and the second external surface 614. Preferably, the patch 600 is elongate and has a generally elliptical periphery 616, having an overall length dimension "L" which is larger than its overall width dimension "W". Preferably, the patch 600 is relatively thin, having a maximum height dimension "H" which is a fraction of its width dimension "W".

An opening 620 is provided which extends into the patch 600 from the first external surface 612 thereof toward the second external surface 614 thereof. Preferably, the opening 620 is located substantially centrally both lengthwise and widthwise, in the patch 600. As best viewed in FIG. 6B, the opening 620 extends to a cavity 622 which is centrally located within the body of the patch 600. The cavity 622 is somewhat larger (in the lengthwise and widthwise dimensions) than the opening, resulting in there being an annular lip 624 disposed at the "entrance" to the opening 620.

The cavity 622 is sized and shaped to be approximately the same size and shape as, or only somewhat larger than the transponder module 602 to be retained by the patch 600, and the annular lip 624 is sized to be somewhat smaller in corresponding dimension than the transponder module 602 so that the transponder module 602 may be inserted through the opening 620 into the cavity 622 by deflecting the annular lip 624, thereafter to be retained within the cavity 622 by the annular lip 624.

For example, the transponder module 602 may be in the general form of a disc having a diameter of approximately 25–60 mm, such as approximately 32 mm, and having a thickness (height) of approximately 3–8 mm, such as approximately 5 mm, in which case the cavity 622 may also suitably be in the general form of a disc, having a diameter comparable (approximately equal) to the diameter of the transponder module and a height comparable (approximately equal) to the thickness of the transponder module 602. The patch opening 620 may have a diameter which is approximately 1–4 mm, such as approximately 2 mm, less than the diameter of the cavity 622 or the transponder module 602. In this way, the annular lip 624 is formed in a manner intended to retain the transponder module 602 within the cavity 622.

The annular lip 624 may be provided with one or more, such as two diametrically-opposed, or three evenly-spaced (as shown), slots 626 in order to facilitate manipulating (deflecting) the annular lip 624 for inserting the transponder module 602 past the lip 624 into the cavity 622, as well as for removing (if necessary) the transponder module 602 from the cavity 622. It is within the scope of the invention that the annular lip 624 may be formed with features other than slots (626), such as serrations, to facilitate transponder insertion or removal.

It is a feature of the present invention that the transponder module 602 can be inserted into the patch 600 either before the patch 600 is affixed to an inside surface of a pneumatic tire, or after the patch 600 is affixed to an inside surface of the tire. And, as mentioned hereinabove, the patch 600 can be affixed to an inside surface of a pneumatic tire either before the tire is built or after the tire is built.

The patch 600 is suitably formed of a resilient material such as halobutyl rubber, so that when a vehicle upon which the tire is mounted is operating (i.e., driving), the patch 600 can flex in unison with the tire within which it is mounted. It should be understood that the patch of the present invention, in its various embodiments described herein, is not limited to any particular one resilient material. A person having ordinary skill in the art to which the invention most nearly pertains will appreciate that the material selected for the patch should not be incompatible with the material of the tire itself, and should be capable of withstanding the ambient temperatures, pressures, and dynamic forces present within a tire. It is also within the scope of the present invention that the patch can be made of two or more materials, layered, and the like. Preferably, in the case of the patch being affixed to an inside surface of a tire in the process of building the tire, portions or all of the patch are suitably semi-cured.

As mentioned above, an advantage of having an opening 620 leading from an external surface 612 of the patch 600 to the cavity 622 within the patch 600 is that the transponder module 602 can be inserted into the patch 600 either before or after the patch 600 is affixed to an inside surface of a pneumatic tire. Another advantage of having the opening 620 is for facilitating removal of the transponder module 602, such as for repair or replacement. Another advantage of having the opening 620 is that the transponder module 602 is accessible while contained within the patch 600, such as for battery replacement, such as is described with respect to the next embodiment. Another advantage of having the opening 620 is that at least a potion of the transponder module 602 is exposed to the ambient environment within the pneumatic tire, such as for sensing air pressure.

Typical dimensions for the transponder module 602, and corresponding typical dimensions for the cavity 622 of the patch 600 have been set forth hereinabove. Typical overall dimensions for the patch 600 are:

A length "L" which is approximately 60–150 mm, such as approximately 80 mm, greater than the diameter of the transponder module 602;

A width "W" which is approximately 30–66 mm, such as approximately 38 mm, greater than the diameter of the transponder module 602; and A height "H" which is approximately 5–20 mm, such as approximately 9 mm, greater than the thickness of the transponder module 602.

An advantage to having the thickness (height "H") of the patch 600 as small as possible, and then tapering gradually to nearly zero thickness at its periphery 616, is so that in the process of laying up a tire on a build drum 610, the filaments 608 will maintain their typically uniform spacing from one another or, in other words, won't "creep" apart from or toward one another.

It is within the scope of this invention that a recess (not shown) can be incorporated into the drum 610 within which the patch 600 can be disposed, so that the external surface 614 of the patch is substantially contiguous with the external surface of the build drum 611.

FIG. 6C illustrates, in cross-sectional view comparable to that of FIG. 6B, an alternate transponder module 602a contained within the patch 600. For purposes of describing this embodiment of the patch 600, all other aspects of the patch 600 can be considered to be similar to those described hereinabove.

The transponder module 602a is disposed within the cavity of the patch 600 which, in turn, is mounted to an inner surface (not shown in this figure) of a pneumatic tire. Herein it can be seen that an additional component 630, such as a battery pack, can be associated with (e.g., plugged into) the transponder module 602a. Although shown as extending out of the opening 620, the additional component 630 may be sized (i.e., in the height dimension) so that it does not extend out of the opening 620.

A benefit of the opening 620 in the patch 600 is that objects which are too tall to be built into a tire may be added to a finished tire when the patch of this invention has been built-in or added to the inner surface of the tire.

An Embodiment of a Patch Which Connects to an Antenna

Thus far there has been described a patch 600 suitable for retaining a transponder module 602 or 602a, and for mounting the transponder module to an inner surface 604 of a pneumatic tire. The patch 600 described hereinabove is made of a resilient material that is intended (and preferably selected) not to attenuate any radio frequency (RF) transmissions either into or out of the transponder module. Nor, on the other hand, is it anticipated that the patch 600 described hereinabove would do anything to directly aid in or augment the transmission or reception of RF signals by the transponder module.

FIGS. 7A, 7B, 7C and 7D illustrate an alternate embodiment of a patch 700 which, for purposes of this description, is generally comparable in overall size, shape and material to the previously-described patch 600, but which has additional components incorporated therein for facilitating the transmission or reception of RF signals by the transponder module 702 (compare 602) retained within the patch. In these figures, the lip 724 (compare 624) is illustrated without slots (see 626) or serrations.

In this embodiment, an antenna 740 having two end portions 742 and 744 is disposed within the tire (not shown), such as about an inner circumference of the tire on an inner surface thereof. The antenna 740 may simply be an elongate conductor, such as a wire, in a loop having two ends (hence, two end portions 742 and 744). Alternately, the antenna 740 may be a dipole antenna with two separate conductors, each conductor having a respective end portion 742 and 744, respectively, extending to within the patch.

A coil 750, comprising at least a few turns of wire and having two ends 752 and 754 is disposed within the body of the patch 700 closely adjacent and surrounding the cavity 722. The coil 750, as will become evident, serves as one "winding" (coupling loop) of a coupling (e.g., input/output) transformer.

The end portion 742 of the antenna 740 extends from outside the patch 700, through the bottom surface 714 thereof, to within the body of the patch 700 where it is connected to the end 752 of the coil 750. In a similar manner, the end portion 744 of the antenna 740 extends from outside the patch 700, through the bottom surface 714 thereof, to within the body of the patch 700 where it is connected to the end 754 of the coil 750.

As shown in FIG. 7C, a transponder module 702 is retained within the patch 700, generally in the manner that the transponder module 602 was retained in the patch 600, described hereinabove. Namely, the transponder module 702 is inserted into the cavity 722 (compare 622) of the patch 700 past an annular lip 724 (compare 624) through an opening 720 (compare 620) in the top surface 712 (compare 612) of the patch 700.

In this example, the transponder module 702 is provided with an internal input/output coil 760, rather than an antenna, which is preferably disposed adjacent the circumferential periphery of the transponder module 702. The transponder module 400 of FIGS. 4A and 4B exemplifies such a transponder module 702, in which case the antenna coil 450 would serve as the input/output coil 760. As mentioned hereinabove, the coil 750 serves as one "winding" of a coupling transformer. The coil 760 is preferably concentric with the coil 750, and located within no more than a few millimeters therefrom, and serves as another winding (coupling loop) of the coupling transformer. In this manner, the antenna 740 may be efficiently coupled ("transformer-coupled") to the coil 760 within the transponder module 702. The function of the "coupling transformer" formed by the two coupling coils 750 and 760 is comparable to that of the transformer 560 described hereinabove with respect to FIGS. 5A and 5B.

Preferably, the two end portions 742 and 744 of the antenna 740 enter the body of the patch 700 at diametrically opposed positions on the patch 700. It is within the scope of this invention that the end portions 742 and 744 of the antenna 740 enter the body of the patch 700 at other than diametrically opposed positions, and other than through the bottom surface 714 as described hereinabove. For example, FIG. 7D shows an alternate embodiment of the patch 700' wherein the end portions 742' and 744' (compare 742 and 744) of the antenna 740' (compare 740) enter the patch 700' (compare 700) through the top surface 712' (compare 712), preferably at points on the periphery of the tapered edge of the patch 700'. The coupling coil 750' corresponds to the coupling coil 750 of FIG. 7C.

Molding the Patch(es)

There has thus been described patches (e.g. 600, 700) suitable for retaining transponder modules (e.g. 602, 702). The latter patch embodiment 700 is suitable for use with an antenna 740 which is external to the transponder module, and also incorporates a coil 750 serving as a winding of a transformer for coupling to a corresponding coil 760 of the transponder module. It is contemplated that the coil 750 is a few (e.g., 2½) turns of wire which are molded (or cast) into the body of the patch 700.

Molding is a well known process whereby materials in a fluid or liquid state are injected or otherwise caused to fill a cavity (or multiple, typically interconnected cavities) in a mold, then permitted (or caused, such as by the application of heat and/or pressure) to solidify (e.g., cure or otherwise harden or become less fluid), after which the mold is removed from around the solidified object (or the solidified object is removed from the mold). A typical mold has two halves which come together in clamshell-type manner to define a closed space within which material to be molded into a molded part is disposed. The interior surfaces of the mold halves typically define the exterior surfaces of the molded part. In order to incorporate a "foreign object" such as the aforementioned coil 750 into the body of the patch 700, it is desirable to prefabricate the coil 750 and support it in any suitable manner within the cavity of the mold. It should be understood that if the antenna wire end portions (e.g., 742 and 744) are to extend outside the mold, appropriate grooves or holes (not shown) should be provided at the outside edges of the mold halves.

FIG. 8 illustrates a mold 800 for molding a patch comparable to the previously-described patch 600. The mold 800 is shown as having two halves, an upper mold half 802 and a lower mold half 804. The upper mold half 802 has an interior surface 806 which is shaped to correspond to a surface of a patch, for example the upper external surface 612 of the patch 600. The lower mold half 804 has an interior surface 808 which is shaped to correspond to another surface of a patch, for example the lower external surface 614 of the patch 600. More particularly, the interior surface 808 of the lower mold half is generally planar. The interior surface 806 of the upper mold half is contoured, to impart the desired taper to the resulting molded part (e.g., patch 600).

A mandrel 810, which may be integral with the upper mold half 802, extends (projects) from the interior surface 806 of the upper mold half 802 toward the interior surface 808 of the lower mold half 804 at a location on the interior surface 806 of the upper mold half 802 whereat it is desired to form the opening (e.g., 620), the annular lip (e.g., 624) and the cavity (e.g., 622) in the patch (e.g., 600) to be molded within the mold 800. Although not shown as such, one of ordinary skill in the art to which the present invention most nearly pertains will understand that the mandrel 810 may be, and may preferably be, a "collapsible" mandrel. A collapsible mandrel is a mandrel which can be collapsed, therefore reduced in size, to permit it to be withdrawn from or through a space or opening in a molded part which has a smaller dimension than the overall mandrel.

A portion 812 of the mandrel 810 is sized and shaped to generally define the resulting size and shape of the cavity (e.g., 622) of the to-be-molded patch (e.g., 600) and, utilizing the example of a cylindrical disc-like cavity set forth hereinabove, is in the general form of a disc having a diameter corresponding to the diameter of the desired cavity (e.g., 622) and a thickness (height) corresponding to the height of the desired cavity (e.g., 622). One skilled in the art to which the invention most nearly pertains will understand that, depending on the materials and processes utilized for molding the molded part (e.g., 600), the mold elements need to be sized to allow for material shrinkage, warpage and the like.

When the mold halves 802 and 804 are brought together, as indicated by the dashed lines in the figure, their interior surfaces 806 and 808 form a cavity into which material for the desired molded part can be introduced, via a suitable orifice or gate (not shown). The material is then permitted (or caused) to harden or solidify (including only partially curing); the mold halves 802 and 804 are separated; the molded part is removed; and, if necessary, the molded part is post-processed (e.g., such as removing flashing, de-junking the finished part, and the like).

It is within the scope of this invention that additional features can be incorporated into the mold halves 802 and 804, such as for forming the slots 626 (or serration, not shown) in the annular lip 624 described hereinabove with respect to FIGS. 6A and 6B.

FIG. 8A illustrates an embodiment of an upper mold half 820 suitable for molding a patch comparable to the previously-described patch 700 having a coil 740 embedded therein. As in the previously-described embodiment of an upper mold half 802, in this embodiment a mandrel 822 (compare 810), which may be integral with the upper mold half 820 (compare 802), extends from the interior surface 824 (compare 806) of the upper mold half 820, and has a portion 826 (compare 812) corresponding to the desired shape of a cavity (e.g., 722), of the resulting patch (e.g., 700). As in the previous example, the mandrel 822 may be a "collapsible" mandrel.

An outer surface 828 of the cavity-defining portion 826 of the mandrel 822 is formed in a manner suitable to have a coil of wire (compare 750) wound around it, for example within a groove 830 spiraling around the outer surface 828 of the cavity-defining portion 826 of the mandrel 822. To accommodate the ends of this coil of wire extending outside the mold, suitable grooves (not shown) may be cut into the inside surface(s) of either or both halves of the mold.

FIG. 8B illustrates a patch 850 resulting from the molding process described with respect to FIG. 8A. Herein it can be seen that the patch has a first external surface 852 (compare 712), a second external surface 854 (compare 714), an opening 856 (compare 720) in the first external surface 852 leading past an annular lip 858 (compare 724) to a cavity 860 (compare 722) within the body of the patch 850. An antenna wire 862 (compare 740) has a first portion 864 (compare 742) entering the patch 850 from the second external surface 854 thereof; has a second portion 866 (compare 750) transitioning from the first portion at point 874 (compare 752), and which was wound around the outer surface 828 of the cavity-defining portion 826 of the mandrel 822; and has a third portion 868 (compare 744) transitioning from the second portion at point 878 (compare 754), and which exits the patch 850 from the second external surface 854 thereof. In this manner, an integral coupling coil is formed by the second portion 866 of the wire 862 which is disposed at a periphery of the cavity 860 so as to be as close as possible (for effective coupling) to a corresponding coupling coil disposed within (or wound about the periphery of) a transponder module compare 702) disposed within the cavity 860 (compare 722).

Molding a Bobbin into the Patch

Evidently, in order to mold the patch 850 using the upper mold half 820 and winding a wire around the periphery 828 of the cavity-defining portion 826 of the mandrel 822, may require that the mandrel be collapsible.

FIG. 9A illustrates a mold 900 for molding a patch 950 comparable to the previously-described patch 850. The mold 900 is shown as having two halves, an upper mold half 902 and a lower mold half 904. The upper mold half 902 has an interior surface 906 which is shaped to correspond to a surface of a patch being molded (not shown), for example the upper external surface 712 of the patch 700. The lower mold half 904 has an interior surface 908 which is shaped to correspond to another surface of the patch being molded, for example the lower external surface 714 of the patch 700. More particularly, the interior surface 908 of the lower mold half is generally planar. The interior surface 906 of the upper mold half is contoured, to impart the desired taper to the resulting molded part (e.g., patch 700). Also, as described hereinabove for the mold in FIG. 8, suitable grooves (not shown) may be cut into the inside surface(s) 906/904 of either or both halves of the mold 902/904 in order to accommodate antenna wires 940 as they exit the mold.

A mandrel 922, which may be integral with the upper mold half 902, extends (projects) from the interior surface 906 of the upper mold half 902 toward the interior surface 908 of the lower mold half 904 at a location on the interior surface 906 of the upper mold half 902 whereat it is desired to form the opening (e.g., 722), the annular lip (e.g., 724) and the cavity (e.g., 720) in the patch (e.g., 700) to be molded within the mold 900.

A portion 926 of the mandrel 922 is sized and shaped to generally define the resulting size and shape of the cavity (e.g., 722) of the to-be-molded patch (e.g., 700) and, utilizing the example of a disc-like cavity set forth hereinabove, is in the general form of a disc having a diameter corresponding to the diameter of the desired cavity (e.g., 722) and a thickness (height) corresponding to the height of the desired cavity (e.g., 722). It should be understood that the mandrel 922 is shown without any features for imparting slots (see 626) to the patch being molded.

When the mold halves 902 and 904 are brought together, as indicated by the dashed lines in the figure, their interior surfaces 906 and 908 form a cavity into which material for the desired molded part can be introduced, via a suitable orifice or gate (not shown). The material is then permitted (or caused) to harden or solidify (including only partially curing); the mold halves 902 and 904 are separated; the molded part is removed; and, if desired or necessary, the molded part is post-processed.

In this embodiment, rather than forming an outer surface 928 (compare 828) of the cavity-defining portion 926 of the mandrel 922 with a groove (830) for winding a wire around the mandrel, a separate bobbin (or spool) element 930 is employed.

The bobbin element 930 is an annulus, having a generally cylindrical interior surface 932, and which is sized to fit about the outer surface 928 of the mandrel 922. The bobbin 930 has an outer surface 934 which is formed with a spiral groove 936 (compare 830) for having a second portion 938 (compare 866) of a wire 940 (compare 862) wound around the bobbin 930. End portions 942 (compare 864) and 944 (compare 868) of the wire exit the mold to become the first and third portions of the antenna wire(s) 940 (compare 862) in the manner described hereinabove.

In order to mold a patch, the bobbin 930, with wire 940 wound thereupon, is slipped into place on the outer surface 928 of the mandrel 922; the wire end portions 942 and 944 are placed in grooves (not shown) allowing them to exit the mold 900 between the mold halves 902 and 904; the mold halves 902 and 904 are brought together; and the cavity defined by the inner surfaces 906 and 908 of the mold halves 902 and 904, respectively, is filled with material suitable to mold a patch. A resulting patch 950 (compare 850) having a bobbin-wound coil disposed within the body of the patch is illustrated in FIG. 9B.

Either or both of the interior surface 932 of the bobbin 930 and/or the outer surface 928 of the mandrel 922 may be tapered, so as to have a slight (e.g., 1–3 degree) "draft angle" which facilitates the mold halves to be readily separated after molding a patch.

FIG. 9B further illustrates, a transponder module 951 (compare 702) retained within the patch 950 (compare 700), generally in the manner that the transponder module 702 was retained in the patch 700, described hereinabove. Namely, the transponder module 951 is inserted into the cavity 960 of the patch 950 past an annular lip 958 through an opening 956 in the top surface 952 of the patch 950. As in FIG. 7C, the transponder module 951 (compare 702) is provided with an internal input/output (coupling) coil 953 (compare 760), which is preferably disposed adjacent the circumferential periphery of the transponder module 951. As mentioned hereinabove, the coil 938 (compare 750) serves as one "winding" of a coupling transformer. The coil 953 (compare 760) is preferably concentric with the coil 938, and located within no more than a few millimeters therefrom, and serves as another winding (coupling loop) of the coupling transformer. In this manner, the antenna 940 (compare 740) may be efficiently coupled to the coil 953 (compare 760) within the transponder module 951 (compare 702).

FIG. 9C illustrates a patch 980 which is an alternate embodiment of the patch 950, wherein the coil of wire 968 (compare 938) is disposed on a bobbin 961 (compare 930) which is smaller in diameter than 930, and has been molded into the patch at a location between the patch's bottom surface 984 (compare 954) and the bottom surface of the cavity 990 (compare 960), underneath the cavity 990. An antenna 970 (compare 940) has two end portions 972 and 974 (compare 942 and 944) entering the patch 980. As in FIG. 9B, the transponder module 951 is shown disposed in the cavity 990. The bobbin 961 is sized so that the turns of wire 968 form a circle of approximately the same outside diameter as the turns of wire 953 in the transponder 951. In this manner, when a transponder (e.g., 951) is placed in a patch (e.g., 980), the two coupling coils (953 and 968, respectively) will be concentric and closely adjacent, and will therefore provide efficient transformer-type coupling of energy.

Although the corresponding mold halves for the patch 980 are not illustrated, it should be evident that the mold cavity between surfaces 906 and 908 would have to be suitably larger to accommodate the extra space needed for the bobbin 961 which would be placed on the bottom mold surface 908 underneath the mandrel 922 which is used to form the cavity 990, lip 988, and opening 986. There may be a groove in, or fingers protruding from, the bottom mold surface 908, either of which would be intended to hold the bobbin 961 in position during the molding process.

One of ordinary skill in the art to which the present invention most nearly pertains will readily understand that other variations on the themes presented hereinabove will accomplish the same objectives (of coupling an antenna wire in a patch to a transponder module contained within that patch), and can be considered within the scope of this invention. For example, the bobbins 961 and 930 could have an annular recess (as in FIG. 9C) instead of a spiral groove (as in FIG. 9B) to contain and shape the coil of wire (968 and 938 respectively). It would also be reasonable to pre-form the coil of wire 968/938 without a permanent bobbin, perhaps holding its shape with paper or plastic non-conductive tape. In addition, as mentioned hereinabove, the antenna 940 or 970 may either exit from the patch through the bottom surface (e.g. 954 as in FIG. 9B), or through the patch's top surface (e.g. 982 as in FIG. 9C).

Alternate Embodiments of Transponder Module

A number of transponder modules, suitable for being retained within a cavity of a patch which is ultimately mounted to an interior surface of a pneumatic tire have been described hereinabove. As mentioned, a transponder module may advantageously include a coil of wire (e.g., 760) comparable to the antenna 450 for coupling RF energy to and from a coil (e.g., 750) embedded within the patch.

FIG. 10A illustrates a transponder module 1000, comparable to the transponder module 400 described hereinabove, but which has a coupling coil 1004 disposed on a bobbin-like external surface (wall) 1002 (compare 408) of the transponder module 1000, rather than being disposed within the transponder module 1000. The coupling coil 1004 is shown "broken", or partially in plan view and partially in cross-section, as "nesting" in a recess 1006 in the external wall 1002 of the transponder module 1000. In this manner, the transponder module coupling coil 1004 can be closely adjacent a coupling coil (e.g., 750, 866, 938) disposed within the body of a patch (e.g., 700, 850, 950, respectively).

The coupling coil 1004 may have two ends (not shown) which extend through corresponding openings (not shown, compare 556 and 558) in the external wall 1002 of the transponder module 1000, suitably in a manner as described hereinabove with respect to the wires 552 and 554 extending through the external wall 508 of the transponder module 500.

FIG. 10B illustrates an alternate embodiment 1020 of a transponder module, comparable to the transponder module 1000 described hereinabove, in that it has a coupling coil 1024 (compare 1004) disposed on a bobbin-like external surface (wall) 1022 (compare 1002) of the transponder module 1020. In this embodiment, the transponder module 1020 also has a coupling coil 1026 disposed on the inside of the external wall 1022. The interior coupling coil 1026 is comparable to the previously-described antenna 450 shown and described with respect to FIG. 4B. A first coupling of RF energy occurs between the coupling coil 1026 on the interior surface of the wall 1022 and the coupling coil 1024 on the exterior surface of the wall 1022.

The transponder module 1020 is suitably disposed in a cavity of a patch, such as has been described hereinabove, so that the coupling coil 1024 is closely adjacent and RF-coupled with a corresponding coupling coil (e.g., 750, 866, 938) disposed within the body of a patch (e.g., 700, 850, 950, respectively). In this "double-coupled" embodiment of a transponder module 1020, it is not necessary that ends of the external coupling coil 1024 extend through corresponding openings (not shown, compare 556 and 558) in the external wall 1022 of the transponder module 1020.

Another Transponder/Patch Embodiment

Patches having coupling coils embedded therein have been described hereinabove as a means to inductively connect an antenna in the tire to a transponder module retained within the patch. There is now described an embodiment of a patch and transducer that is modified to have "hard-wired", yet removable connections between an antenna in the tire and a transponder module retained within the patch.

FIG. 11 illustrates an embodiment of a patch 1100 for retaining a transponder module 1102.

The patch 1100 is similar in size, shape and materials to any of the patches (e.g., 600) described hereinabove in that it has two major external surfaces, a first external surface 1112 (compare 612), a second external surface 1114 (compare 614) opposite the first external surface 1112, a periphery 1116 (compare 616), and is tapered from a maximum thickness (height) at its center to a minimum thickness at its periphery 1116.

A central opening 1120 (compare 620) is provided which extends into the patch 1100 from the first external surface 1112 thereof toward the second external surface 1114 thereof. The opening 1120 extends to a cavity 1122 (compare 622) which is centrally located within the body of the patch 1100. The cavity 1122 is somewhat wider than the opening, resulting in there being an annular lip 1124 (compare 624) disposed at the "entrance" to the opening 1120. The cavity 1122 is sized and shaped to be approximately the same size and shape as, or only somewhat larger in width and height than the transponder module 1102 (compare 602).

The patch 1100 is similar to other patches (e.g., 700) described hereinabove in that an antenna 1140 (compare 740) has two end portions 1142 and 1144 (compare 742 and 744) that enter into the body of the patch 1100. However, rather than terminating in a coupling coil (e.g., 750), the two end portions 1142 and 1144 terminate in electrical terminals which are contact pads 1152 and 1154 respectively, disposed on an interior (e.g., bottom) surface 1126 of the cavity 1122.

The transponder module 1102 is similar to other transponder modules (e.g., 200) described hereinabove in that appropriate (for performing the desired transponder functions) electronic components are disposed within a housing 1104 (compare 254).

In this embodiment of a transponder module 1102, rather than the transponder module having its own antenna (e.g., 450), or a coupling coil (e.g., 760) inductively coupling to a corresponding coupling coil (e.g., 750) within the patch, "hard-wired", yet removable (dis-connectable) connections are made between the antenna 1140 and the transponder module 1102, in the following manner.

As described hereinabove, the electronic components (e.g., 102, 122) disposed within the transponder housing are suitably interconnected with one another via a leadframe (e.g., 130) having a plurality of leadframe fingers, some of which suitably extend from the interior of the transponder module housing to the exterior of the transponder module housing.

In this embodiment of a transponder module 1102, selected ones 1132 and 1134 of a plurality of leadframe fingers extend from within the interior of the transponder module housing 1104 to the exterior of the transponder module housing 1104 and, as illustrated, may be formed so as to lay flat on an external surface of the transponder module 1102, such as on a bottom surface 1106 (compare 106b) thereof. The portions of the leadframe fingers 1132 and 1134 disposed on the bottom surface 1106 of the housing, are positioned to align with the contact pads 1152 and 1154 disposed on the bottom surface 1126 of the cavity 1122. In this manner, when the transponder module 1102 is inserted into the cavity 1122 of the patch 1100, electrical connections can be effected between the leadframe fingers 1132 and 1134 and the contact pads 1152 and 1154, respectively, so as to electrically connect the antenna 1140 to the transponder module 1102.

In order to ensure contact between the transponder leadframe fingers 1132/1134 and the patch contact pads 1152/1154, the fingers or the pads may be extended in an arc-like manner around the surfaces they lie on. There may also be notches, protrusions, or other irregularities in the inside surface of the cavity 1122 which correspond to mating irregularities in the outside surface of the transponder 1102. These mating irregularities would allow for registration of the transponder to the cavity, thereby holding the two parts in the an orientation which maintains contact between the fingers 1132/1134 and their corresponding contact pads 1152/1154. These features are not shown in FIG. 11, but should be readily apparent to one practiced in the art which most nearly pertains to the present invention.

FIG. 11A illustrates an alternate embodiment of the concepts presented in FIG. 11, wherein two end portions 1142' and 1144' (compare 1142 and 1144) of an antenna 1140' (compare 1140) terminate in electrical terminals which are contact plugs 1152' and 1154' (compare 1152 and 1154). The contact plugs 1152'/1154' are disposed on an interior (e.g., bottom) surface 1126' (compare 1126) of the cavity 1122' (compare 1122). The contact plugs 1152'/1154' (compare 1152/1554) may be formed in the shape of prongs, such as flat "male" spade prongs or bullet-like pins", and portions of the leadframe fingers 1132'/11341 (compare 1132/1134) may be formed as corresponding (mating) "female receptacle contacts" which mate with respective ones of the prongs 1152'/1154'. In this manner, when the transponder 1102' is properly inserted in the cavity 1122' of the patch 1100', the prongs 1152'/1154' would "plug in" to their corresponding receptacles 1132'/1134' in much the same way that an electrical cord end plugs into a wall receptacle. The design of such plug/receptacle pairs is well known in the electrical industry, and the claim of this invention lies in the area of its application to patches and mating transponder modules such as are illustrated in FIG. 11A. It is within the scope of this invention that the plug/receptacle pairs could use different materials (e.g., spring steel or conductive rubber) and could take different forms, such as reversing the contacts to make 1132' and/or 1134' as plug prongs and making 1152' and/or 1154' as their mating receptacle contacts.

Although only two pads 1152/1154 or two prongs 1152'/1154' are illustrated in FIGS. 11 and 11A, it should be understood that two or more than two pads or prongs may be provided, and they may be disposed symmetrically or asymmetrically on the surface 1126, 11261 of the cavity 1122, 1122', respectively.

Antenna Design Considerations

In a number of embodiments described hereinabove, an antenna (e.g., 740, 1140) has been briefly described as having two end portions (e.g., 742/744, 1142/1144) which enter the body of the patch (e.g., 700, 1100) and which are either connected to a coupling coil (e.g., 750) surrounding the transponder module-receiving cavity (e.g., 722) within the body of the patch (e.g., 700), or which are connected to contact pads (e.g., 1152/1154) on a surface of the transponder module receiving cavity (e.g., 1122) within the body of the patch (e.g., 1100).

It should be clearly understood that any antenna having two end portions, whether or not the antenna is a loop antenna (for example, the antenna could be a dipole antenna) is suitable for use with the patch embodiments described herein. Additionally, the antenna may be either attached to the inside surface of the tire, or embedded within the carcass of the tire.

For example, as discussed hereinabove, PCT Patent Application No. PCT/US90/01754 discloses a loop-type antenna which comprises a receiver/transmitter coil having one or more loops of wire strategically placed along the sidewall or in proximity to the tread face of the tire, as well as various possible locations for an antenna/coil which is embedded within the carcass of the tire. As disclosed therein, the antenna/coil may be formed of one or more turns of insulated wire, or bare wire separated by insulating rubber in the manufacturing process. Acceptable materials for the wire are stated as including steel, aluminum, copper or other electrically conducting wire. As disclosed therein, the wire diameter is not generally considered critical for operation as an antenna for a transponder. For durability, stranded steel wire consisting of multiple strands of fine wire is preferred. Other wire options available include ribbon cable, flexible circuits, conductive film, conductive rubber, etc. The type of wire and number of loops in the antenna/coil is a function of the anticipated environment of the tire use and the preferred distance of interrogator communication. It is proposed therein that the greater the number of loops of the transponder's antenna/coil, the greater the distance of successful interrogation of a given tire transponder.

There are now described a number of embodiments of antennas which are particularly well-suited to be used in conjunction with the patches described herein.

Antenna Embodiments

FIGS. 12A and 12B illustrate an embodiment of an antenna 1200 extending about the entire inner surface 1202 (compare 314, 604) of a pneumatic tire 1204 (compare 312). The antenna 1200 is essentially an elongate loop of wire. One segment or end portion 1208 (compare 742) of the antenna 1200 terminates at a coupling coil or contact pad (neither of which are shown in these figures) within a patch 1210 (compare 700) in which there is a transponder module (e.g., 702). The other segment or end portion 1212 (compare 744) of the antenna 1200 terminates in like manner at a coupling coil or contact pad within the patch 1210. The antenna 1200 is affixed in any suitable manner to the inner surface 1202 of the tire 1204, and may optionally be embedded (fully or partially) under the inner surface 1202 of the tire 1204 during tire manufacturing.

Preferably, the antenna 1200 is formed as an elongated spiral of wire, or helix.. For example, referring to FIG. 12C, a length of wire 1220 having a diameter (gauge) "d" of between approximately 0.15 mm and approximately 0.30 mm can be coiled into a helix with an overall diameter "D" of between approximately 1.0 mm and approximately 2.0 mm. Such a helical antenna can be fabricated to have an initial (starting) pitch "P" (as measured from one coil turn to the next) of between approximately ONE or TWO wire diameters (P=between 1$d$ and 2$d$), and can stretch out in length to several, such as FIVE, times its initial length.

The wire 1220 is, of course, electrically conductive, and is suitably brass-plated high-tensile strength steel which exhibits good mechanical strength and resistance to corrosion when placed in the environment of the interior of a pneumatic tire. Alternatively, the wire 1220 can be nickel or gold plated.

It is within the scope of the invention that the antenna 1200 can be formed in two segments which are two separate lengths of wire, each segment having a first end portion extending from within the patch 1210, and each length of wire extending at least partially (e.g., approximately halfway) around the circumference of the inner surface 1202 of the tire 1204. Two such lengths of wire can be joined in any suitable manner (such as by wrapping or soldering) at their second ends opposite to the patch, to form a complete loop antenna extending around the entire circumference of the inner surface 1202 of the tire 1204. Alternatively, the free ends could be left unattached, thereby forming a dipole antenna with poles 1208 and 1210, disposed about the circumference of the inner surface 1202 of the tire 1204. As has been mentioned hereinabove, the antennas described as extending around the circumference of the inner surface of the tire could be either attached (mounted) to the inner surface of the tire or embedded in the tire carcass under the inner surface.

Embodiments of Antennas and Corresponding Patches

As discussed hereinabove, an antenna may suitably be formed as two individual lengths of wire, each emanating from a patch having a transponder module therein, each spanning approximately one-half the circumference of the inner surface of the tire, and either joined to one another at their opposite ends to form a complete loop antenna, or left unconnected so that they form a dipole antenna.

FIG. 13A illustrates an embodiment of component 1300 of an antenna comprising an elongate wire 1302, which is preferably a helical coiled wire comparable to the aforementioned helical wire 1220, embedded in a strip 1304 of rubber material which is suitable for bonding to an inside surface of a pneumatic tire. The strip 1304 of rubber material has a one end 1306 and an opposite end 1308, and may either be electrically insulating (non-conductive) or an electrically conductive composition. The strip 1304 is shown as having a tapered profile, but it should be understood, and it is within the scope of the invention, that its cross-section could be rectangular, semicircular, or any shape preferably having at least one flat side suitable for bonding to a substantially flat inside surface of a pneumatic tire. Alternatively, for antennas which may be embedded in the tire carcass, the strip 1304 could have any cross-sectional shape, but is preferably round, with the diameter of the rubber material only slightly larger than the diameter "D" of the antenna wire 1302.

It should be understood that, in this and other embodiments of antennas having wires embedded in rubber strips, that the wire may be other than an elongate helix such as the wire 1220. For example, the embedded wire may be a single elongate strand of wire, multiple strands of wire, a braided wire, or the like. It is also within the scope of the invention that the wire is not a metallic wire at all, but rather conductive pathways, such as of a carbon containing material, and more particularly a carbon fiber, embedded in the rubber strip(s). Other electrically conducting materials useful for such conductive pathways include carbon black or particulate graphite.

Conductive rubber compositions are well known, as evidenced, for example, by the disclosures of conductive rubber compositions in commonly-owned U.S. Pat. No. 5,143,967 (Krishnan, et al.; 1992) and U.S. Pat. No. 4,823,942 (Martin, et al.; 1989), both of which are incorporated in their entirety by reference herein. One having ordinary skill in the art to which the present invention most nearly pertains will appreciate that the choice of one conductive rubber composition over another does not form a critical element of the present invention, per se, but rather will depend upon application-specific parameters, including the composition of the tire surface to which the antenna is mounted, the material of the antenna, and the like.

FIG. 13B illustrates an embodiment of an antenna 1320 having two segments made of individual lengths of wire 1322 and 1324 (compare 1302), with each length of wire embedded in a strip of rubber material 1326 and 1328, respectively (compare 1304). The lengths of wire 1322 and 1324 may be straight wires or elongate helixes of wire as described hereinabove.

The strip 1326 of rubber material is elongate, and has two ends, a first end 1326a and a second end 1326b. A first portion 1326c of the strip 1326, extending from the first end 1326a partially toward the second end 1326b, is of a conductive rubber composition, as described hereinabove. A remaining second portion 1326d of the strip 1326, extending from the second end 1326b partially toward the first end 1326a, is optionally (as shown) of a non-conductive rubber composition, as described hereinabove.

The length of wire 1322 is elongate, and has two ends, a first end 1322a and a second end 1322b. A first end portion 1322c of the elongate length of wire 1322, extending from the first end 1322a partially toward the second end 1322b, is embedded in the first portion 1326c of the strip 1326. A second portion 1322d of the wire 1322, is embedded in the second portion 1326d of the strip 1326. A third portion 1322e of the wire 1322 extends out of the second end 1326b of the strip 1326.

The strip 1328 of rubber material is elongate, and has two ends, a first end 1328a and a second end 1328b. A first portion 1328c of the strip 1328, extending from the first end 1328a partially toward the second end 1328b, is of a conductive rubber composition, as described hereinabove. A remaining second portion 1328d of the strip 1328, extending from the second end 1328b partially toward the first end 1328a, is optionally (as shown) of a non-conductive rubber composition, as described hereinabove.

The length of wire 1324 is elongate, and has two ends, a first end 1324a and a second end 1324b. A first end portion 1324c of the elongate length of wire 1324, extending from the first end 1324a partially toward the second end 1324b, is embedded in the first portion 1328c of the strip 1328. A second portion 1324d of the wire 1324, is embedded in the second portion 1328d of the strip 1328. A third portion 1324e of the wire 1324 extends out of the second end 1328b of the strip 1328.

The end portion 1322e of the wire 1322 suitably extends from a patch, for example, as the end portion 864 of the wire 862 in the patch 850, as described hereinabove. Likewise, the end portion 1324e of the wire 1324 suitably extends from a patch, for example, as the end portion 868 of the wire 862 in the patch 850, as described hereinabove.

When installed on an inner surface of a tire, the first end portions 1326c and 1328c of the strips 1326 and 1328, respectively, can be overlapped (as indicated by the dashed lines) and joined with one another so that the two wires 1322 and 1324 form a loop antenna extending completely about the circumference of the inner surface of the tire, as shown for the antenna 1200 in FIG. 12A.

As mentioned hereinabove, the end portions 1326c and 1328c of the strips 1326 and 1328, respectively, are preferably formed of a conductive rubber material (composition). In this manner, the two end portions 1322c and 1324c of the wires 1322 and 1324, respectively, can be electrically-connected with one another via the conductive nature of the rubber material within which they are embedded. The conductive rubber material preferably exhibits as great a conductivity as possible, for example, approximately 10 ohm-centimeters. As is known, this will result in an effective conductive path between the two end portions 1322ca and 1324ca of the wires 1322 and 1324, wherein the conductivity increases in proportion to the overlapping area of the two end portions 1326c and 1328c, and decreases as the distance between the two wire portions 1322c and 1324c.

FIG. 13C shows a side cross-sectional view of a tire 1350 (compare 1204), having an inner surface 1352 (compare 1202) and an outer surface 1354, a patch 1356 (compare 1210) having a transponder module (not shown) disposed therein, and a loop (360 degree) antenna 1360 (compare 1200) emanating from two opposite edges of the patch 1356 and spanning the entire circumference of the inner surface 1352 of the tire 1350.

The antenna 1360 has a first elongate section 1362 (compare 1326) extending from the patch at least approximately halfway (180 degrees) around the circumference of the tire, and a second elongate section 1364 (compare 1328) extending from the patch (in the manner described hereinabove) at least approximately halfway (180 degrees) around the circumference of the tire. Distal from the patch, the end portions 1366 and 1368 (compare 1326c and 1328c, respectively) of the antenna sections 1362 and 1364, respectively, are overlapped at a position on the inner surface 1352 of the tire 1350 which is preferably diametrically opposed to the position of the patch 1356. In this manner, the mass of the patch (with transponder disposed therein) can be at least partially counterbalanced by the double thickness of antenna sections in their overlapping end portions 1366 and 1368.

FIG. 13D shows a side cross-sectional view of a tire 1350' (compare 1350), having an inner surface 1352' (compare 1352) and an outer surface 1354' (compare 1354), a patch 1356' (compare 1356) having a transponder module (not shown) disposed therein, and a dipole antenna 1360' (compare 1360) emanating from two edges of the patch 1356' and proceeding around the circumference of the inner surface 1352' of the tire 1350'.

The antenna 1360' has a first elongate section 1362' (compare 1362) extending from the patch approximately halfway (1800) around the circumference of the tire, and a second elongate section 1364' (compare 1364) extending from the patch (in the manner described hereinabove) approximately halfway (1800) around the circumference of the tire. Distal from the patch, the end portions 1366' and 1368' (compare 1366 and 1368, respectively) of the antenna sections 1362' and 1364', respectively, are shown to end before they overlap each other at a position slightly less than 180° around the circumference of the inner surface 1352' of the tire 1350'. Since the ends 1366' and 1368' of the antenna 1360' are electrically isolated from each other, the antenna 1360' becomes a dipole antenna instead of a loop antenna. An alternate embodiment (not shown) for this type of dipole antenna comprises extending the two elongate sections 1362' and 1364' around the circumference more than 180° while still preventing electrical contact between the elongate sections as they pass alongside each other.

FIG. 14A illustrates another embodiment of a combination of a transponder module mounted within a patch and an antenna emanating from the patch. Each of these components is similar in some respects to their counterparts in previously-described embodiments, for example: the transponder module 1102, the patch 1100, and the antenna 1320.

A patch 1400 (compare 1100) has an upper surface 1412 (compare 1112) and a lower surface 1414 (compare 1114), and an opening 1420 (compare 1120) extending past a lip 1424 (compare 1124) to a cavity 1422 (compare 1122) within the body of the patch.

A transponder module 1402 (compare 1102) has a housing 1404 (compare 1104) and contact pads 1432 and 1434 (compare 1132 and 1134) disposed on a bottom surface 1406 (compare 1106) of the housing.

The patch 1400 is provided with electrically-conductive contact plugs (slugs) 1452 and 1454 (compare the contact pads 1152 and 1154) extending from within the cavity 1422 to the bottom surface 1414 of the patch 1400. These plugs could be slugs of metal, conductive rubber, or other electrically conductive material. The contact plugs 1452 and 1454 are exposed within the cavity 1422, such as by extending slightly beyond the inner surface 1426 (compare 1126) of the cavity, and are aligned (as indicated by the dashed lines) to make electrical contact with the contact pads 1432 and 1434, respectively, of the transponder module 1402 when the transponder module 1402 is disposed within the cavity 1422 of the patch 1400.

As described hereinabove, in order to ensure proper electrical connection between the transponder contacts and the patch contacts, the pads 1432/1434 and/or plugs 1452/1454 can be extended around the transponder or cavity; or matching irregularities in the transponder and cavity surfaces can be used to register the position of the transponder in the cavity. Alternatively, the transponder and patch contacts can be formed as mating plug/receptacle pairs as described hereinabove with respect to FIG. 11A (e.g., 1152'/1132').

An antenna 1440 (compare 1140, 1320) comprises two individual lengths of wire 1442 and 1444 (compare 1322 and 1324), each length of wire embedded in a strip of rubber material 1446 and 1448 (compare 1326 and 1328), respectively. The lengths of wire 1442 and 1444 may each be elongate helixes of wire as described hereinabove with respect to FIG. 12C. Each strip 1446 and 1448 of rubber material is elongate and, in a manner similar to that previously described with respect to the strips 1326 and 1328, may have two end sections 1446a/1446b and 1448a /1448b, respectively, which are of a conductive material, and a central section 1446c and 1448c, respectively, between the two end sections which is of a non-conductive material.

The conductive end section 1446a of the strip 1446 is aligned (as indicated by the dashed line) with the conductive plug 1452. The conductive end section 1448a of the strip 1448 is aligned (as indicated by the dashed line) with the conductive plug 1454. In the manner described hereinabove with respect to FIG. 13C, the strips 1446 and 1448 (compare 1362 and 1364) extend about the circumference of the inner surface (compare 1352) of the tire (compare 1350), where their opposite end sections 1446b and 1448b (compare 1366 and 1368) may be overlapped to electrically connect the wires 1442 and 1444, respectively, embedded therein so as to form a loop antenna within the tire.

Alternatively, a dipole antenna could be formed in the manner described hereinabove with respect to FIG. 13D, wherein the end sections 1446b and 1448b (compare 1366' and 1368') would not electrically connect the wire 1442 to the wire 1444. For this dipole antenna embodiment, the end sections 1446b and 1448b would advantageously be made of the same non-conductive rubber as the middle sections 1446c and 1448c.

The patch 1400 and the antenna 1440 (comprising sections 1446 and 1448) may be assembled simply by positioning the patch 1400 on the build drum 610 (preferably in a recess), then laying out the strips 1446 and 1448 with their conductive end sections 1446a and 1448a positioned over the contact slugs 1452 and 1454, respectively; overlapping the end sections 1446b and 1448b of the strips 1446 and 1448, respectively for a loop antenna, or not overlapping for a dipole antenna; and continuing with the lay-up of the tire being fabricated.

Alternatively, the strips 1446 and 1448 can first be mounted or secured to the bottom surface 1414 of the patch 1400. Alternatively, the strips 1446 and 1448 can be integrally formed with the patch 1400, during molding of the patch 1400. One having ordinary skill in the art to which the present invention most nearly pertains will understand these variations, based on the disclosure of various embodiments and techniques set forth herein.

FIG. 14B illustrates another embodiment of an antenna 1460. In this embodiment, a full loop antenna can be formed from two lengths of wire 1462 and 1464 (compare 1442 and 1444) which are embedded in a single long strip of rubber material 1466 (compare 1446 and 1448). In this embodiment, the strip 1466 is shown as having two end sections 1466a and 1466b (compare 1446a, 1446b, 1448a, 1448b) which are formed of a conductive rubber composition, and a central section 1466c (compare 1446c, 1448c), between the two end sections 1466a and 1466b which is formed of a non-conductive material. This antenna 1460 may be readily substituted for the antenna 1440 of the previously-described embodiment.

As mentioned hereinabove, the antenna strip or strips can first be integrated with the patch itself. For example, as illustrated in FIG. 14C, an antenna strip 1460 (of the type shown and described with respect to FIG. 14B) can be placed in a mold 800 (of the type shown and described with respect to FIG. 8) so as to be molded integrally with a patch. Furthermore, conductive plugs 1452 and 1454 (of the type shown and described with respect to FIG. 14A) may be disposed in the mold, so as to be molded into the resulting patch.

Regarding the various antennas (e.g., 740) for transponder modules described hereinabove, one having ordinary skill in the art to which the invention most nearly pertains will understand that various aspects of antenna design, such as the overall length of a loop antenna, the lengths of the legs of a dipole antenna, impedance, and the like, depend largely on the frequency (or frequencies) at which the antenna is intended to operate, as well as the desired propagation and reception characteristics of the antenna in a given environment. It should be understood that the present invention is not limited to any particular operating frequency for the antenna, however, specific mention is made of the antennas disclosed herein being suitable to operate at 124 kHz or 13.56 MHz.

Although the invention has been illustrated and described in detail in the drawings and foregoing description, the same is to be considered as illustrative and not restrictive in character, it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A patch suitable for mounting a transponder module having at least a substantial portion of which is generally disc-shaped wherein the disc-shaped portion has a diameter and a height which is substantially less than the diameter, to an inner surface of a pneumatic tire, said patch comprising a body formed of a resilient material and having a first external surface, and a second external surface opposite the first external surface, characterized by:

a substantially circular opening extending into the patch from the first external surface toward the second external surface, and extending to a cavity in the body of the patch;

the cavity being generally disc-shaped and sized to be approximately the same diameter and height as the disc-shaped portion of the transponder module; and the opening has a somewhat smaller diameter than the cavity, thereby forming a resilient annular lip about the opening, the lip thereby being sized to be somewhat smaller in diameter than the disc-shaped portion of the transponder module so that the transponder module may be inserted through the opening into the cavity by deflecting the resilient annular lip and thereby retained within the cavity by the resilient annular lip; and at least one slot in the lip to facilitate deflecting the lip for inserting the transponder module past the lip into the cavity.

2. A patch, according to claim 1, characterized by:
an antenna, having two end portions, each end portion extending from outside the patch to within the body of the patch.

3. A patch, according to claim 2, characterized in that:
the two end portions of the antenna enter the body of the patch at diametrically opposed positions on the patch.

4. A patch, according to claim 2, characterized in that:
the antenna is selected from a group consisting of loop antenna and dipole antenna.

5. A patch, according to claim 2, characterized in that:
the antenna extends circumferentially about an inner surface of the tire.

6. A patch, according to claim 1, characterized by:
electrical terminals disposed on an inner surface of the cavity for making connections with corresponding electrical terminals on an external surface of the transponder module when the transponder module is disposed within the cavity.

7. A patch suitable for mounting a transponder module having at least a substantial portion of which is generally disc-shaped wherein the disc-shaped portion has a diameter and a height which is substantially less than the diameter, to an inner surface of a pneumatic tire, said patch comprising a body formed of a resilient material and having a first external surface, and a second external surface opposite the first external surface, characterized by:

a substantially circular opening extending into the patch from the first external surface toward the second external surface, and extending to a cavity in the body of the patch;

the cavity being generally disc-shaped and sized to be approximately the same diameter and height as the disc-shaped portion of the transponder module; and the opening has a somewhat smaller diameter than the cavity, thereby forming a resilient annular lip about the opening, the lip thereby being sized to be somewhat smaller in diameter than the disc-shaped portion of the transponder module so that the transponder module may be inserted through the opening into the cavity by deflecting the resilient annular lip and thereby retained within the cavity by the resilient annular lip; and a coupling coil comprising at least a few turns of wire is disposed within the body of the patch closely adjacent and surrounding the cavity.

8. A patch, according to claim 7, characterized in that:
the coupling coil has two ends; and characterized by:
an antenna having two end portions, each end portion extending from outside the patch to within the body of the patch and connected to a respective one of the two ends of the coupling coil.

9. A patch, according to claim 7, characterized in that:
the coupling coil is disposed on a bobbin which is molded into the body of the patch.

10. A patch suitable for mounting a transponder module having at least a substantial portion of which is generally disc-shaped wherein the disc-shaped portion has a diameter and a height which is substantially less than the diameter, to an inner surface of a pneumatic tire, said patch comprising a body formed of a resilient material and having a first external surface, and a second external surface opposite the first external surface, characterized by:

a substantially circular opening extending into the patch from the first external surface toward the second external surface, and extending to a cavity in tile body of the patch;

the cavity being generally disc-shaped and sized to be approximately the same diameter and height as the disc-shaped portion of the transponder module; and the opening has a somewhat smaller diameter than the cavity, thereby forming a resilient annular lip about the opening, the lip thereby being sized to be somewhat smaller in diameter than the disc-shaped portion of the transponder module so that the transponder module may be inserted through the opening into the cavity by deflecting the resilient annular lip and thereby retained within the cavity by the resilient annular lip; and a coupling coil comprising at least a few turns of wire is disposed within the body of the patch closely adjacent and underneath the cavity.

11. A patch, according to claim 10, characterized in that:
the coupling coil has two ends; and further comprising:
an antenna having two end portions, each end portion extending from outside the patch to within the body of the patch and connected to a respective one of the two ends of the coupling coil.

12. A patch, according to claim 10, characterized in that:
the coupling coil is disposed on a bobbin [(961)] which is molded into the body of the patch.

13. A method of mounting a transponder module having at least a substantial portion of which is generally disc-shaped wherein the disc-shaped portion has a diameter and a height which is substantially less than the diameter, to an inner surface of a pneumatic tire, comprising:
providing a patch having a body formed of a resilient material and having a first external surface, and a second external surface opposite the first external surface; and
affixing the patch to the inner surface of the tire; characterized by:
the provided patch having a substantially circular opening extending into the patch from the first external surface toward the second external surface, and extending to a cavity in the body of the patch, the cavity being generally disc-shaped and sized to be approximately the same diameter and height as the disc-shaped portion of the transponder module; and the opening having a somewhat smaller diameter than the cavity, thereby forming a resilient annular lip about the opening, the lip thereby being sized to be somewhat smaller in diameter than the disc-shaped portion of the transponder module and at least one slot in the lip to facilitate deflecting the lip for inserting the transponder module past the lip into the cavity; and
inserting the transponder module through the opening into the cavity by deflecting the resilient annular lip such that the disc-shaped potion of the transponder module is retained within the cavity by the resilient annular lip.

14. Method, according to claim 13, characterized by:
affixing the patch to the inner surface of the tire during the fabrication of the tire.

15. Method, according to claim 13, characterized by:
affixing the patch to the inner surface of the tire after the fabrication of the tire.

16. Method, according to claim 13, characterized by:
inserting the transponder module into the patch before the patch is affixed to the inner surface of the tire.

17. Method, according to claim 13, characterized by:
inserting the transponder module into the patch after the patch is affixed to the inner surface of the tire.

18. Method, according to claim 13, characterized by:
coupling an antenna to the transponder module with a coil disposed within the body of the patch.

19. Method, according to claim 13, characterized by:
coupling an antenna to the transponder module with electrical contacts disposed on an inner surface of the cavity.

* * * * *